(12) United States Patent
Cho et al.

(10) Patent No.: US 12,402,400 B2
(45) Date of Patent: Aug. 26, 2025

(54) MULTI GATE SEMICONDUCTOR DEVICE

(71) Applicant: SAMSUNG ELECTRONICS CO., LTD., Suwon-si (KR)

(72) Inventors: Nam Kyu Cho, Yongin-si (KR); Seok Hoon Kim, Suwon-si (KR); Sang Gil Lee, Ansan-si (KR); Pan Kwi Park, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 18/055,813

(22) Filed: Nov. 15, 2022

(65) Prior Publication Data
US 2023/0207559 A1  Jun. 29, 2023

(30) Foreign Application Priority Data
Dec. 28, 2021  (KR) .......................... 10-2021-0189233

(51) Int. Cl.
*H01L 27/088* (2006.01)
*H01L 29/06* (2006.01)
(Continued)

(52) U.S. Cl.
CPC ............. *H10D 84/83* (2025.01); *H10D 30/43* (2025.01); *H10D 30/6729* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6729; H10D 30/6735; H10D 30/797; H10D 62/021; H10D 62/118; H10D 62/119; H10D 62/121; H10D 62/149; H10D 62/151; H10D 62/832; H10D 84/013; H10D 84/0158; H10D 84/017; H10D 84/0193; H10D 84/83; H10D 84/834; H10D 84/853

See application file for complete search history.

(56) References Cited

U.S. PATENT DOCUMENTS 9,660,028 B1  5/2017 Cheng et al.
9,947,804 B1  4/2018 Frougier
(Continued)

*Primary Examiner* — David C Spalla
(74) *Attorney, Agent, or Firm* — MORGAN, LEWIS & BOCKIUS LLP

(57) ABSTRACT

A semiconductor device includes a first active pattern having a first lower pattern and a first sheet pattern on the first lower pattern. First gate structures include a first gate electrode. A second active pattern includes a second lower pattern. A second sheet pattern is on the second lower pattern. Second gate structures include a second gate electrode that surrounds the second sheet pattern. A first source/drain recess is between adjacent first gate structures. A second source/drain recess is between adjacent second gate structures. A first source/drain pattern extends along the first source/drain recess. A first silicon germanium filling film is on the first silicon germanium liner. A second source/drain pattern includes a second silicon germanium liner extending along the second source/drain recess. A second silicon germanium filling film is on the second silicon germanium liner.

20 Claims, 22 Drawing Sheets

(51) Int. Cl.
*H01L 29/08* (2006.01)
*H01L 29/161* (2006.01)
*H01L 29/417* (2006.01)
*H01L 29/423* (2006.01)
*H01L 29/775* (2006.01)
*H10D 30/43* (2025.01)
*H10D 30/67* (2025.01)
*H10D 62/10* (2025.01)
*H10D 62/13* (2025.01)
*H10D 62/832* (2025.01)
*H10D 84/83* (2025.01)

(52) U.S. Cl.
CPC ....... *H10D 30/6735* (2025.01); *H10D 62/121* (2025.01); *H10D 62/151* (2025.01); *H10D 62/832* (2025.01)

(56) References Cited

U.S. PATENT DOCUMENTS

| | | |
|---|---|---|
| 10,431,663 B2 | 10/2019 | Xie et al. |
| 10,672,764 B2 | 6/2020 | Kim et al. |
| 10,930,868 B2 | 2/2021 | Cho et al. |
| 2020/0091349 A1* | 3/2020 | Kang ................ B82Y 10/00 |
| 2020/0381546 A1* | 12/2020 | Cho ................ H10D 30/014 |
| 2020/0381547 A1* | 12/2020 | Song ................ H10D 30/6735 |
| 2020/0381564 A1 | 12/2020 | Kang et al. |
| 2020/0396470 A1 | 12/2020 | Kim et al. |
| 2021/0057288 A1 | 2/2021 | Jeon et al. |
| 2021/0057411 A1 | 2/2021 | Kim et al. |
| 2021/0066477 A1 | 3/2021 | Lee et al. |
| 2021/0134795 A1* | 5/2021 | Ju ................ H10D 64/518 |
| 2021/0217860 A1 | 7/2021 | Ha et al. |
| 2021/0367063 A1 | 11/2021 | Kao et al. |
| 2022/0157938 A1* | 5/2022 | Lin ................ H10D 30/6735 |

* cited by examiner

MULTI GATE SEMICONDUCTOR DEVICE

CROSS-REFERENCE TO RELATED APPLICATION

This application claims priority under 35 U.S.C. § 119 to Korean Patent Application No. 10-2021-0189233, filed on Dec. 28, 2021 in the Korean Intellectual Property Office, the contents of which are herein incorporated by reference in its entirety.

TECHNICAL FIELD

The present invention relates to a semiconductor device, and more specifically, to a multi gate semiconductor device.

DISCUSSION OF THE RELATED ART

One approach for increasing the density of semiconductor devices is to utilize a multi gate transistor in which a multi-channel active pattern (or a silicon body) having a fin or nanowire shape is formed on a substrate and a gate is formed on a surface of the multi-channel active pattern has been proposed.

Since such a multi gate transistor utilizes a three-dimensional channel, scaling is easily performed. Further, even if a gate length of the multi gate transistor is not increased, the current control capability may be improved. Furthermore, a SCE (short channel effect) in which potential of a channel region is influenced by a drain voltage may be effectively suppressed.

SUMMARY

A semiconductor device includes a first active pattern which includes a first lower pattern extending in a first direction, and a first sheet pattern disposed on the first lower pattern. A plurality of first gate structures includes a first gate electrode that at least partially surrounds the first sheet pattern on the first lower pattern. The first gate electrode extends in a second direction. A second active pattern includes a second lower pattern extending in the first direction. A second sheet pattern is disposed on the second lower pattern. A plurality of second gate structures includes a second gate electrode that at least partially surrounds the second sheet pattern on the second lower pattern. The second gate electrode extends in the second direction. A first source/drain recess is defined between the first gate structures adjacent to each other in the first direction. A second source/drain recess is defined between the second gate structures adjacent to each other in the first direction. A first source/drain pattern includes a first silicon germanium liner extending along side walls and a bottom surface of the first source/drain recess. A first silicon germanium filling film is disposed on the first silicon germanium liner. A second source/drain pattern includes a second germanium liner extending along side walls and a bottom surface of the second source/drain recess. A second silicon germanium filling film is disposed on the second silicon germanium liner. A width of an upper surface of the first lower pattern in the second direction is smaller than a width of an upper surface of the second lower pattern in the second direction. A thickness of the first silicon germanium filling film is smaller than a thickness of the second silicon germanium filling film.

A semiconductor device includes a first active pattern which includes a first lower pattern extending in a first direction. A first sheet pattern is disposed on the first lower pattern. A plurality of first gate structures includes a first gate electrode that at least partially surrounds the first sheet pattern on the first lower pattern. The first gate electrode extends in a second direction. A second active pattern includes a second lower pattern extending in the first direction. A second sheet pattern is disposed on the second lower pattern. A plurality of second gate structures includes a second gate electrode that at least partially surrounds the second sheet pattern on the second lower pattern. The second gate electrode extends in the second direction. A first source/drain recess is defined between the first gate structures adjacent to each other in the first direction. A second source/drain recess is defined between the second gate structures adjacent to each other in the first direction. A first source/drain pattern includes a first silicon germanium liner extending along side walls and a bottom surface of the first source/drain recess. A first silicon germanium filling film is disposed on the first silicon germanium liner. A second source/drain pattern includes a second silicon germanium liner extending along side walls and a bottom surface of the second source/drain recess. A second silicon germanium filling film is disposed on the second silicon germanium liner. A width of an upper surface of the first lower pattern in the second direction is smaller than a width of the upper surface of the second lower pattern in the second direction. A height of the first source/drain pattern is smaller than a height of the second source/drain pattern, in a cross-sectional view taken in the first direction. An upper surface of the first source/drain pattern is planar or has a concave shape, and in the cross-sectional view taken in the first direction, an upper surface of the second source/drain pattern has a convex shape.

A semiconductor device includes a first active pattern which includes a first lower pattern extending in a first direction. A first sheet pattern is disposed on the first lower pattern. A plurality of first gate structures include a first gate electrode that at least partially surrounds the first sheet pattern on the first lower pattern. The first gate electrode extends in a second direction. A second active pattern includes a second lower pattern extending, in the first direction. A second, sheet pattern is disposed on the second lower pattern. A plurality of second gate structures include a second gate electrode that at least partially surrounds the second sheet pattern on the second lower pattern. The second gate electrode extends in the second direction. A first source/drain recess is defined between the first gate structures adjacent to each other in the first direction, and includes a plurality of first width extension regions. A second source/drain recess is defined between the second gate structures adjacent to each other in the first direction, and includes a plurality of second width extension regions. A first source/drain pattern includes a first silicon germanium liner extending along side walls and a bottom surface of the first source/drain recess. A first silicon germanium filling film is disposed on the first silicon germanium liner. A second sources/drain pattern includes a second silicon germanium liner extending along side walls and a bottom surface of the second source/drain recess. A second silicon germanium filling film is disposed on the second silicon germanium liner. A width of an upper surface of the first lower pattern in the second direction is smaller than a width of the upper surface of the second lower pattern in the second direction. A width of each of the first width extension regions in the first direction increases and then decreases, towards a direction away from the upper surface of the first lower pattern. A width of each of the second width extension regions in the first direction increases and then decreases, towards a direction away from the upper surface of the second lower pattern. A height of the first source/drain pattern is smaller than a height of the second source/drain pattern. A thickness of the first silicon germanium liner on the bottom surface of the first source/drain recess is the same as a thickness of the second silicon germanium liner on the bottom surface of the second source/drain recess. A width of the first source/drain pattern protruding in the second direction from the side walls of the first lower pattern is smaller than a width of the second source/drain pattern protruding in the second direction from the side walls of the second lower pattern.

BRIEF DESCRIPTION OF DRAWINGS

The above and other aspects and features of the present disclosure will become more apparent by describing in detail embodiments thereof with reference to the attached drawings, in which.

DETAILED DESCRIPTION OF THE EMBODIMENTS

A semiconductor device, according to embodiments, may include a tunneling transistor (tunneling FET), a three-dimensional (3D) transistor, a transistor based on two-dimensional material (2D material based FETs), and a heterostructure thereof. Further, the semiconductor device, according to embodiments, may also include a bipolar junction transistor, a laterally diffused metal oxide semiconductor (LDMOS), or the like.

The semiconductor device, according to embodiments, will be described referring to FIGS. 1 to 9.

Figure 1:
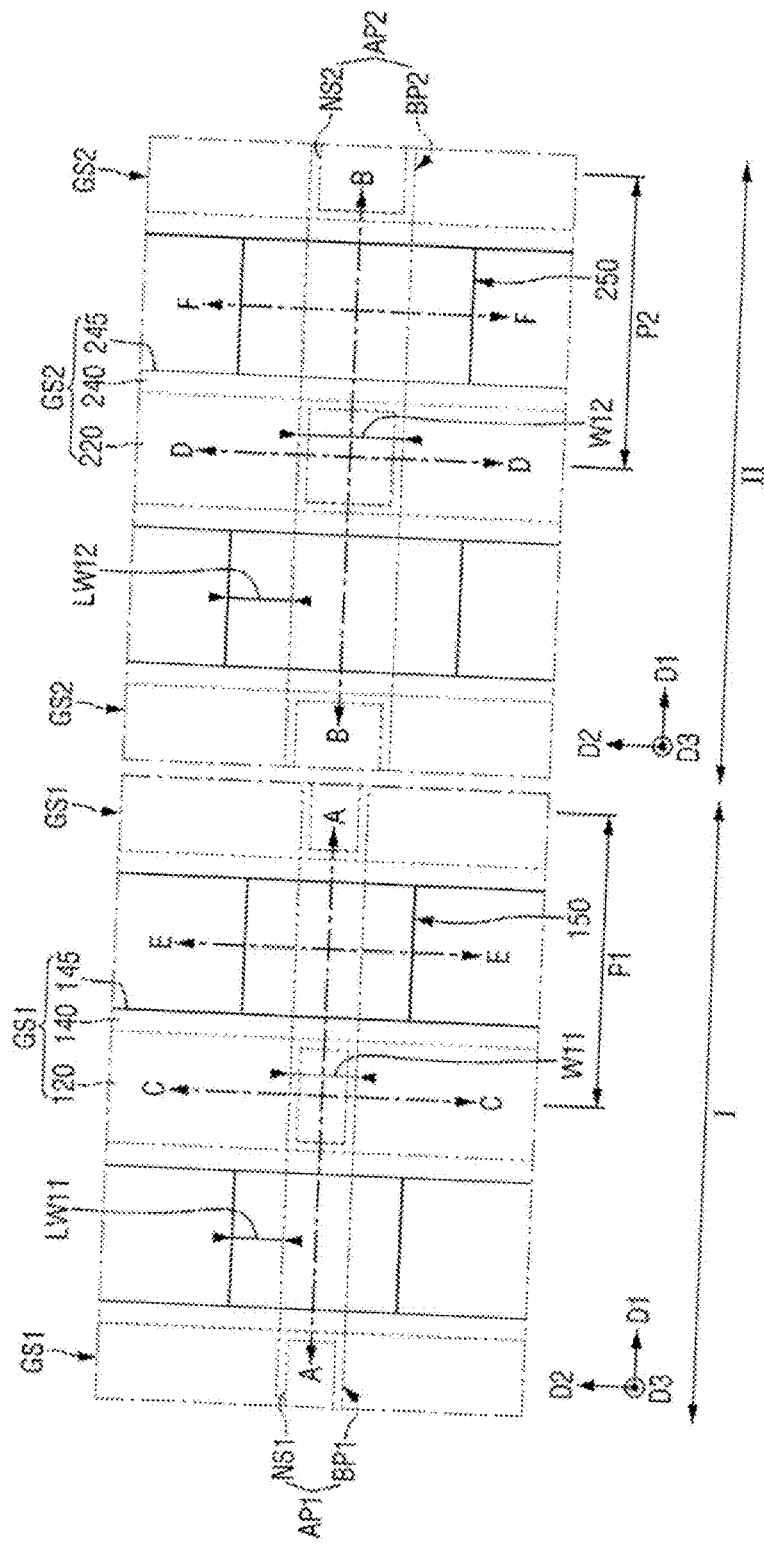
FIG. 1 is a plan view illustrating a semiconductor device, according to embodiments.
Figure 2:
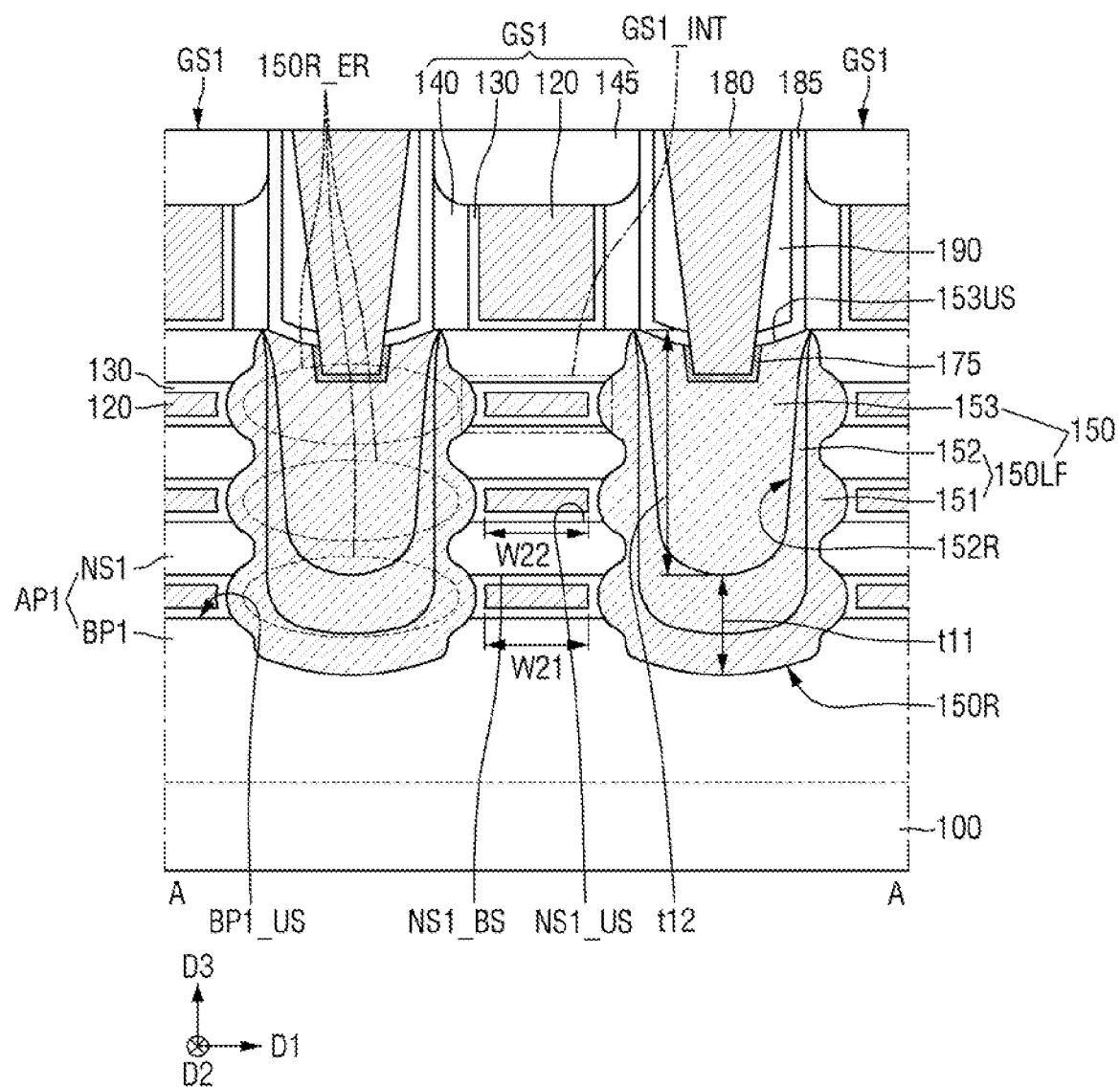
FIGS. 2 and 3 are cross-sectional views taken along A-A and B-B of FIG. 1.
Figure 3:
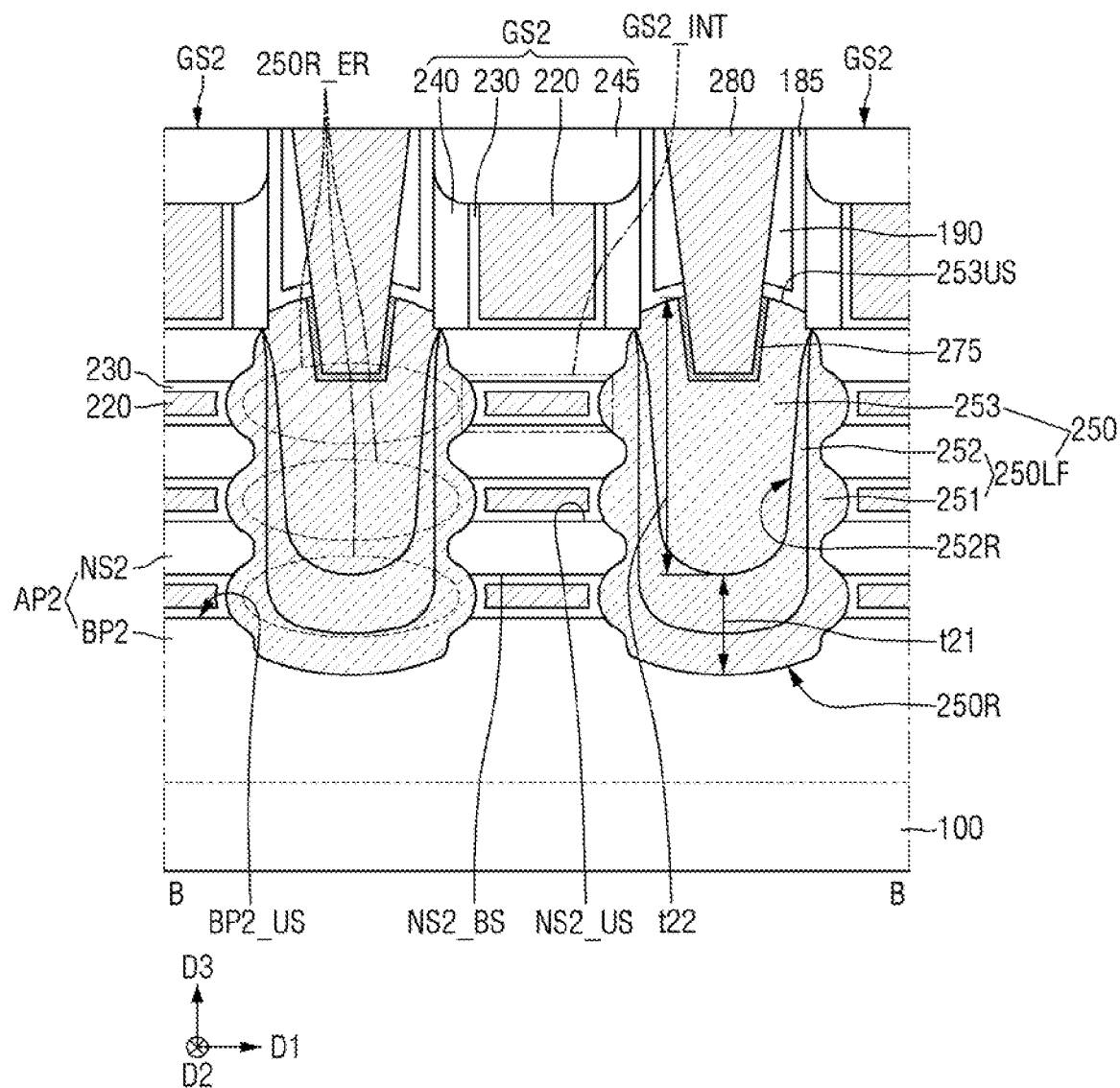
Figure 4:
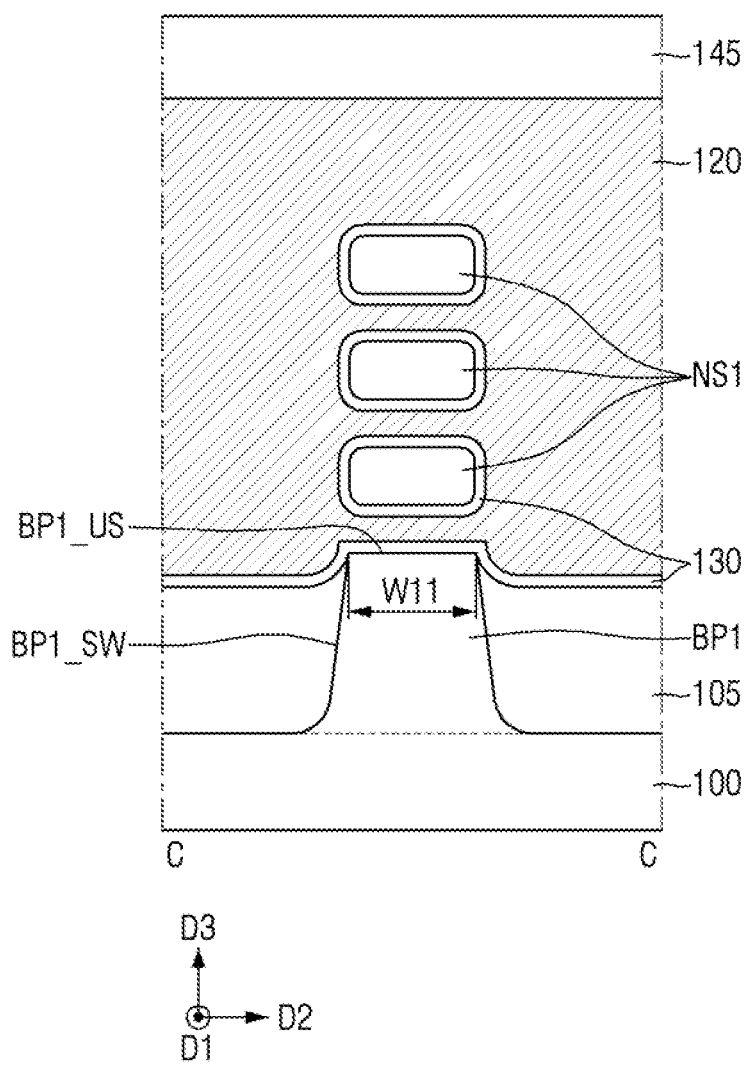
FIGS. 4 and 5 are cross-sectional views taken along C-C and D-D of FIG. 1.
Figure 5:
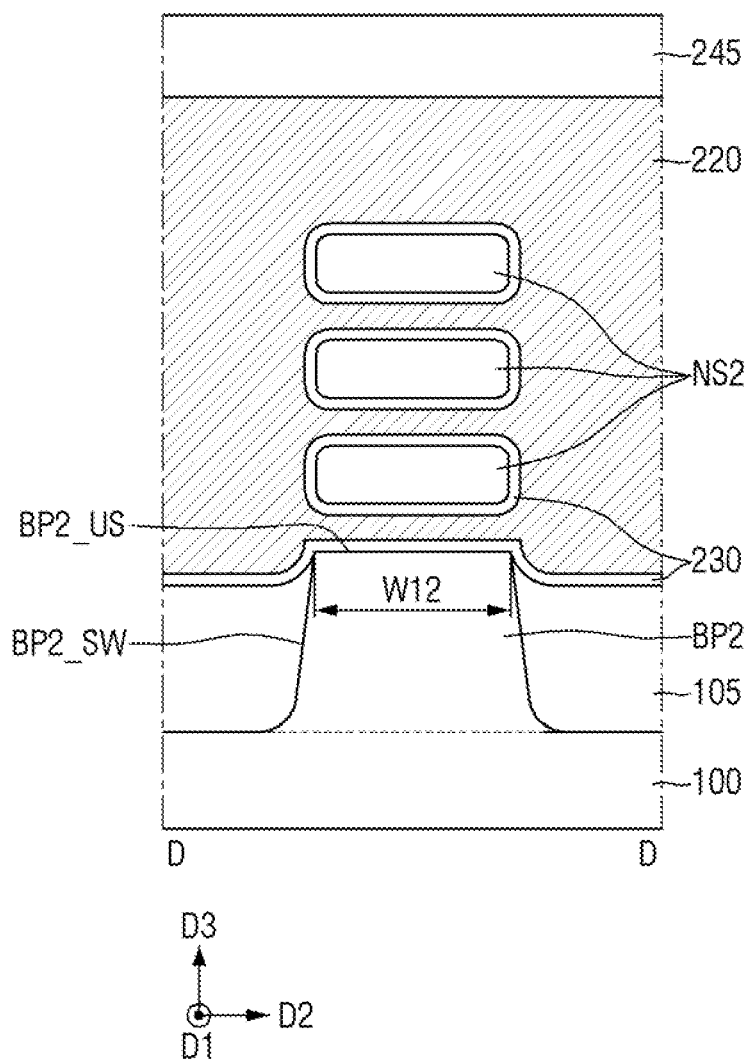
Figure 6:
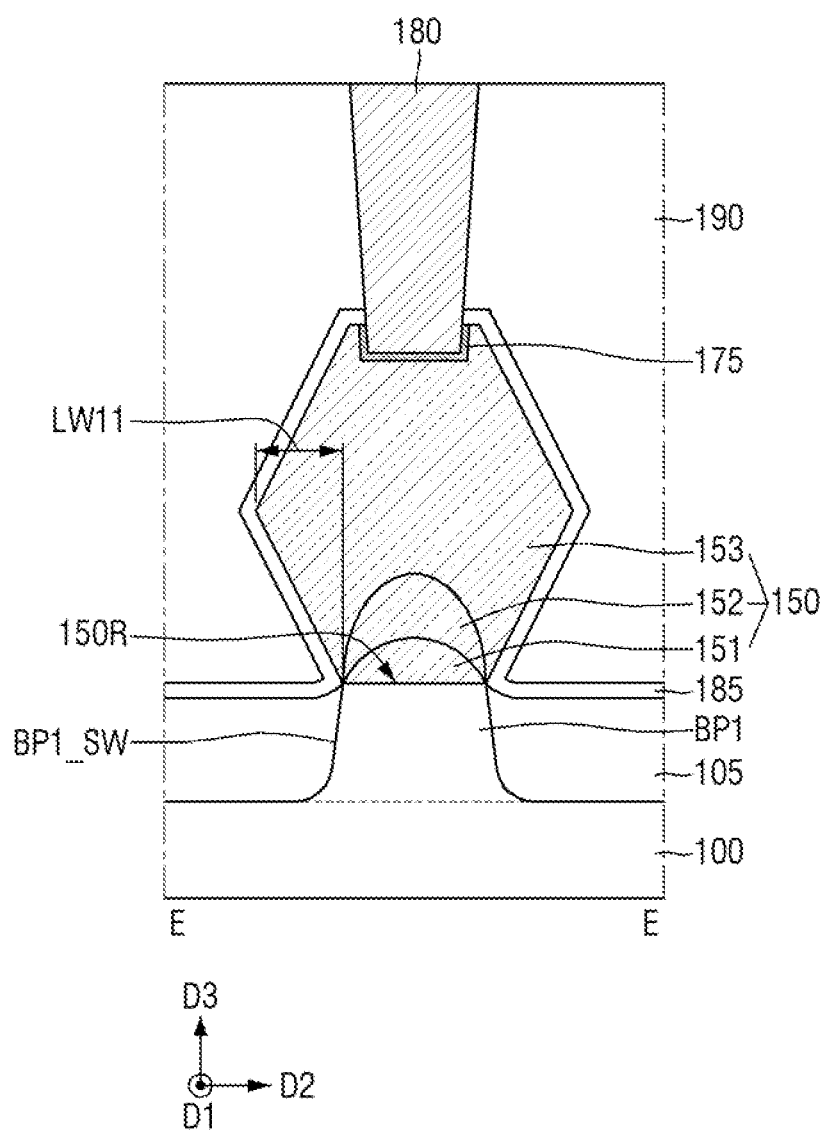
FIGS. 6 and 7 are cross-sectional views taken along F-F and F-F of FIG. 1.
Figure 7:
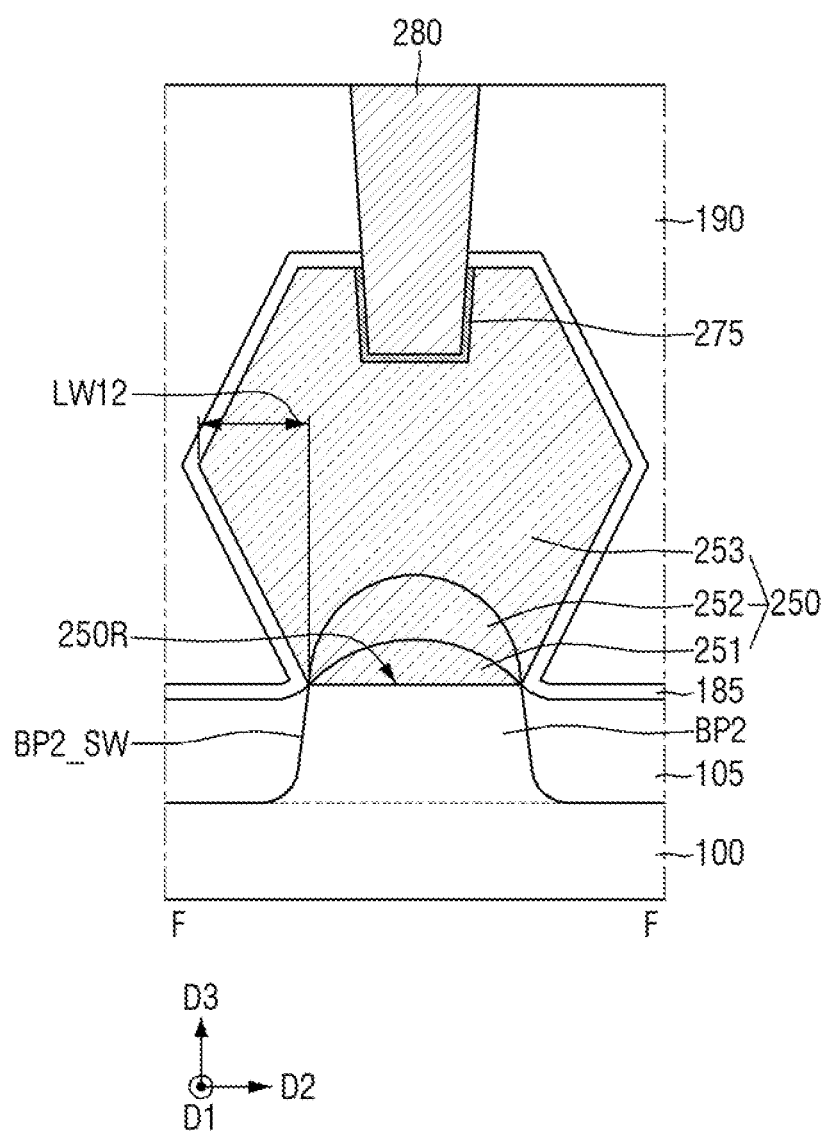
Figure 8:
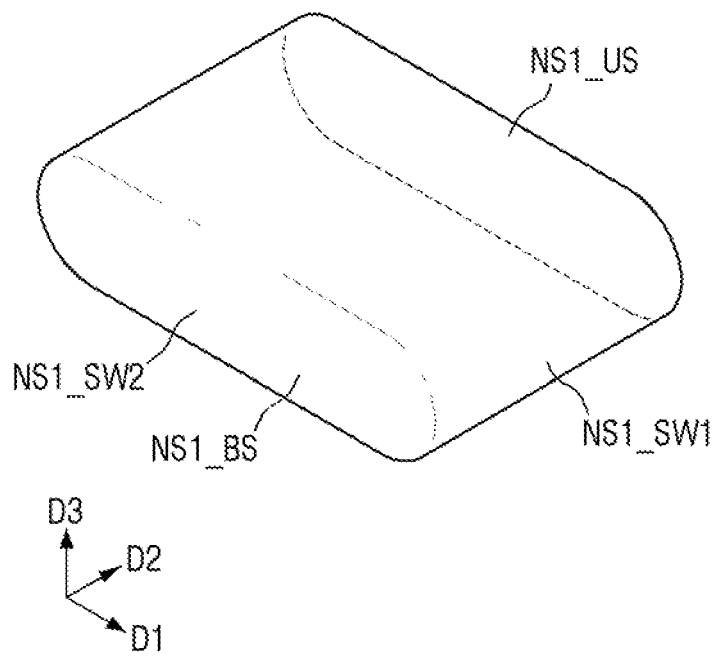
FIG. 8 is a diagram illustrating a shape of a first sheet pattern of FIG. 2.

FIG. 1 is a plan view illustrating a semiconductor device, according to embodiments. FIGS. 2 and 3 are cross-sectional views taken along A-A and B-B of FIG. 1. FIGS. 4 and 5 are cross-sectional views taken along C-C and D-D of FIG. 1. FIGS. 6 and 7 are cross-sectional views taken along E-E and F-F of FIG. 1. FIG. 8 is a diagram illustrating a shape of a first sheet pattern of FIG. 2.

Many of the structures of FIG. 1 have been simplified for descriptive purposes and to better understand the arrangement of gate insulating films 130 and 230 an etching stop film 185, an interlayer insulating film 190, and the like.

Referring to FIGS. 1 to 8, the semiconductor device, according to embodiments, includes a first active pattern AP1, a plurality of first gate structures GS1, a first source/drain pattern 150, a second active pattern AP2, a plurality of second gate structures GS2, and a second source/drain pattern 250.

The substrate 100 may include a first region I and a second region II. The first region I and the second region II may be regions in which a PMOS is formed.

The substrate 100 may be a bulk silicon or a silicon on insulator (SOI). In contrast, the substrate 100 may be a silicon substrate, or may include, but is not necessarily limited to including, other materials, for example, silicon germanium, silicon germanium on insulator (SGOI), indium antimonide, lead tellurium compounds, indium arsenic, indium phosphate, gallium arsenide or antimonide gallium.

A first active pattern AP1, a plurality of first gate structures GS1, and a first source/drain pattern 150 are disposed in a first region I of the substrate 100. A second active pattern AP2, a plurality of second gate structures GS2, and a second source/drain pattern 250 are disposed in a second region II of the substrate 100.

The first active pattern AP1 and the second active pattern AP2 may each be disposed on the substrate 100. The first active pattern AP1 and the second active pattern AP2 may each extend along a first direction D1.

One of the first active pattern AP1 and the second active pattern AP2 may extend in the first direction D1, and the other thereof may extend in the second direction D2. In the following description, the first active pattern AP1 and the second active pattern AP2 will be described as extending in the first direction D1.

The first active pattern AP1 and the second active pattern AP2 may each be multi-channel active patterns. The first active pattern AP1 may include a first lower pattern BP1 and a plurality of first sheet patterns NS1. The second active pattern AP2 way include a second lower pattern BP2 and a plurality of second sheet patterns NS2.

The first lower pattern BP1 may protrude from the substrate 100. The first lower pattern BP1 may extend along the first direction D1. The second lower pattern BP2 protrudes from the substrate 100. The second lower pattern BP2 may extend along the first direction D1.

A width W11 of an upper surface BP1_US of the first lower pattern in the second direction D2 is different from a width W12 of an upper surface BP2_US of the second lower pattern in the second direction D2. For example, the width W11 of the upper surface BP1_US of the first lower pattern in the second direction D2 is smaller than the width W12 of the upper surface BP2_US of the second lower pattern in the second direction D2.

The plurality of first sheet patterns NS1 may be disposed on the upper surface BP1_US of the first lower pattern. The plurality of first sheet patterns NS1 may be spaced apart from the first lower pattern BP1 in a third direction D3. Each first sheet pattern NS may be spaced apart from one another in the third direction D3.

The plurality of second sheet patterns NS2 may be disposed on the upper surface BP2_US of the second lower pattern. The plurality of second sheet patterns NS2 may be spaced apart from the second lower pattern BP2 in the third direction D3. Each second sheet pattern NS2 may be spaced apart from one another in the third direction D3.

Each first sheet pattern NS1 may include an upper surface NS1_US and a lower surface NS1_BS. The upper surface NS1_US of the first sheet pattern is a surface opposite to the lower surface NS1_BS of the first sheet pattern in the third direction D3. Each first sheet pattern NS1 may include first side walls NS1_SW1 opposite to each other in the first direction D1, and second side walls NS1_SW2 opposite to each other in the second direction D2.

The upper surface NS1_US of the first sheet pattern and the lower surface NS1_BS of the first sheet pattern may be connected by the first side walls NS1_SW1 of the first sheet pattern and the second side walls NS1_SW2 of the first sheet pattern. The first side walls NS1_SW1 of the first sheet pattern are connected to and brought into contact with a first source/drain pattern 150, to be described later. The first side walls NS1_SW1 of the first sheet pattern may include an end of the first sheet pattern NS1. For example, the end of the first sheet pattern NS1 may be disposed at a center line between the upper surface NS1_US of the first sheet pattern and the lower surface NS1_BS of the first sheet pattern.

In FIGS. 2 and 8, although the first side wall NS1_SW1 of the first sheet pattern is shown as a curved surface protruding toward the first source/drain pattern 150, the embodiment is not necessarily limited thereto. For example, the first side walls NS1_SW1 of the first sheet pattern may be a combination of a curved surface portion and a flat surface portion.

Further, although FIGS. 4 and 8 show that the second side walls NS1_SW2 of the first sheet pattern is a combination of the curved surface portion and the flat surface portion, the embodiment is not necessarily limited thereto. For example, the second side walls NS1_SW2 of the first sheet pattern may be a curved surface as a whole or a flat surface as a whole.

The above description of the first sheet pattern NS1 may also be applicable to the second sheet pattern NS2.

The third direction D3 may be a direction that intersects the first direction D1 and the second direction D2. For example, the third direction D3 may be a thickness direction of the substrate 100. The first direction D1 may be a direction that intersects the second direction D2.

Although three first sheet patterns NS1 and second sheet patterns NS2 are shown as being disposed in the third direction D3, this is one particular arrangement, and the present invention is not necessarily limited thereto.

The first lower pattern BP1 and the second lower pattern BP2 may each be formed by etching a portion of the substrate 100, and may include an epitaxial layer grown from the substrate 100. The first lower pattern BP1 and the second lower pattern BP2 may each include silicon or germanium, which is an elemental semiconductor material. Further, the first lower pattern BP1 and the second lower pattern. BP2 may each include a compound semiconductor, and may include, for example, a group IV-IV compound semiconductor or a group III-V compound semiconductor.

The group IV-IV compound semiconductor may include, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, at least one of a binary compound, a ternary compound or a quaternary compound formed by combining at least one of aluminum (AD, gallium (Ga) and indium (In) as a group element with one of phosphorus (P), arsenic (As) and antimony (Sb) as a group V element.

The first sheet pattern NS1 and the second sheet pattern NS2 may each include one of silicon or germanium which is an elemental semiconductor material, a group IV-IV compound semiconductor, or a group III-V compound semiconductor. Each first sheet pattern NS1 may include the same material as the first lower pattern BP1 and may include a different material from the first lower pattern BP1. Each second sheet pattern NS2 may include the same material as the second lower pattern BP2, and may include a different material from the second lower pattern BP2.

In the semiconductor device, according to embodiments, the first lower pattern BP1 and the second lower pattern BP2 may be silicon lower patterns each including silicon, and the first sheet pattern NS1 and the second sheet pattern NS2 may be a silicon sheet pattern each including silicon.

The width of the first sheet pattern NS1 in the second direction D2 may increase or decrease in proportion to the width of the upper surface BP1_US of the first lower pattern in the second direction D2. The width of the second sheet pattern NS2 in the second direction D2 may increase or decrease in proportion to the width of the upper surface BP2_US of the second lower pattern in the second direction D2.

Because the width W11 of the upper surface BP1_US of the first lower pattern in the second direction D2 is smaller than the width W12 of the upper surface BP2_US of the second lower pattern in the second direction D2, the width of the first sheet pattern NS1 disposed at the same height level in the second direction D2 is smaller than the width of the second sheet pattern NS2 in the second direction D2.

Although it is shown that the widths in the second direction D2 of the first sheet patterns NS1 stacked in the third direction D3 are the same, and the widths in the second direction D2 of the first sheet patterns NS1 stacked in the third direction D3 are the same, this is one particular arrangement, and the embodiment is not necessarily limited thereto. Unlike the shown example, in a direction away from the first lower pattern BP1 and the second lower pattern BP2, the width in the second direction D2 of the first sheet patterns NS1 and the width in the second direction D2 of the second sheet patterns NS2 stacked in the third direction D3 may decrease.

The field insulating film 105 may be formed on the substrate 100. The field insulating film 105 may be disposed on the side walls BP1_SW of the first lower pattern and the side walls BP2_SW of the second lower pattern. The field insulating film 105 is not disposed on the upper surface BP1_US of the first lower pattern and the upper surface BP2_US of the second lower pattern.

As an example, the field insulating film 105 may completely cover the side walls BP1_SW of the first lower pattern and the side walls BP2_SW of the second lower pattern. Unlike the shown example, the field insulating film 105 may cover a portion of the side walls BP1_SW of the first lower pattern and a portion of the side walls BP2_SW of the second lower pattern. In such a case, a portion of the first lower pattern BP1 and a portion of the second lower pattern BP2 may protrude from the upper surface of the field insulating film 105 in the third direction D3.

Each first sheet pattern NS1 is disposed higher than the upper surface of the field insulating film 105. The field insulating, film 105 may include, for example, an oxide film, a nitride film, an oxynitride film or a combination thereof. Although the field insulating film 105 is shown as a single film, this is one particular arrangement, and the embodiment is not necessarily limited thereto.

A plurality of first gate structures GS1 may be disposed on the substrate 100, Each first gate structure GS1 may extend in the second direction D2. The first gate structures GS1 may be spaced apart from each other in the first direction D1. The first gate structures GS1 may be adjacent to each other in the first direction D1.

The first gate structure GS1 may be disposed on the first active pattern AP1. The first gate structure GS1 may intersect the first active pattern AP1. The first gate structure GS1 may intersect the first lower pattern BP1. The first gate structure GS1 may at least partially surround each first sheet pattern NS1. The first gate structure GS1 may include, for example, a first gate electrode 120, a first gate insulating film 130, a first gate spacer 140, and a first gate capping pattern 145.

The first gate structure GS1 may include a first inter-gate structure GS1_INT disposed between the first sheet patterns NS1 adjacent to each other in the third direction D3, and between the first lower pattern BP1 and the first sheet pattern NS1. The first inter-gate structure GS1_INT may include a first gate electrode 120 and a first gate insulating film 130 disposed between the adjacent first sheet patterns NS1 and between the first lower pattern BP1 and the first sheet pattern NS1.

A plurality of second gate structures GS2 may be disposed on the substrate 100. Each second gate structure GS2 may extend in the second direction D2. The second gate structures GS2 may be spaced apart from each other in the first direction D1. The second gate structures GS2 may be adjacent to each other in the first direction D1.

When the first active pattern AP1 and the second active pattern AP2 extend in different directions, the direction in which the second gate structure GS2 extends is different from the direction in which the first gate structure GS1 extends.

The second gate structure GS2 may be disposed on the second active pattern AP2. The second gate structure GS2 may intersect the second active pattern AP2. The second gate structure GS2 may intersect the second lower pattern BP2. The second gate structure GS1 may at least partially surround each second sheet pattern NS2. The second gate structure GS2 may include, for example, a second grate electrode 220, a second gate insulating film 230, a second gate spacer 240, and a second gate capping pattern 245.

The second gate structure GS2 may include a second inter-gate structure GS2_INT disposed between the second sheet patterns NS2 adjacent to each other in the third direction D3, and between the second lower pattern BP2 and the second sheet pattern NS2. The second inter-gate structure GS2_INT may include a second gate electrode 220 and a second gate insulating film 210.

The first gate electrode 120 may be formed on the first lower pattern BP1. The first gate electrode 120 intersects the first lower pattern BP1. The first gate electrode 120 may at least partially surround the first sheet pattern NS1. A portion of the first gate electrode 120 may be disposed between the adjacent first sheet patterns NS1, and between the first lower pattern BP1 and the first sheet pattern NS1.

The second gate electrode 220 may be formed on the second lower pattern BP2. The second gate electrode 220 may intersect the second lower pattern BP2. The second gate electrode 220 may at least partially surround the second sheet pattern NS2. A portion of the second gate electrode 220 may be disposed between the adjacent second sheet patterns NS2, and between the second lower pattern BP2 and the second sheet pattern NS2.

The first gate electrode 120 disposed between the first lower pattern BS1 and the first sheet pattern NS1 may have a first gate width W21 in the first direction D1. The first gate electrode 120 disposed between the first sheet patterns NS1 adjacent to each other in the third direction D3 may have a second gate width W22 in the first direction D1. In the semiconductor device, according to embodiments, the first gate width W21 may be the same as the second gate width W22. The first gate width W21 and the second gate width W22 are the widths of the first gate electrode 120 included in the first inter-gate structure GS1_INT.

A relationship between the widths of the second gate electrodes 220 included in the second inter gate structure GS2_INT may be the same as a relationship between the widths of the first gate electrodes 120 included in the first inter-gate structure GS1_INT.

A first separation distance P1 between the first gate electrodes 120 adjacent to each other in the first direction D1 is the same as a second separation distance P2 between the second gate electrodes 220 adjacent to each other in the first direction D1.

The first irate electrode 120 and the second gate electrode 220 may each include, at least one of a metal, a metal alloy, a conductive metal nitride, a metal silicide, a doped semiconductor material, a conductive metal oxide and a conductive metal oxynitride. The first gate electrode 120 may include, for example, but is not necessarily limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC) tungsten carbide (WC), rhodium (Rh), palladium (Pd), iridium (Ir), osmium (Os), silver (Ag), gold (Au), zinc (Zn), vanadium (V), and combinations thereof. The conductive metal oxide and the conductive metal oxynitride may include, but are not necessarily limited to including, the oxidized form of the above-mentioned materials.

The first gate electrode 120 may be disposed on opposite sides of a first source/drain pattern 150 to be described later. The first gate structure GS1 may be disposed on opposite sides of the first source/drain pattern 150 in the first direction D1.

As an example, both the first gate electrodes 120 disposed on opposite sides of the first source/drain pattern 150 may be normal gate electrodes used as the gates of the transistor. As another example, the first gate electrode 120 disposed on one side of the first source/drain pattern 150 is used as a gate of the transistor, but the first gate electrode 120 disposed on the other side of the first source/drain pattern 150 may be a dummy gate electrode.

The second gate electrode 220 may be disposed on opposite sides of a second source/drain pattern 250 to be described later. The second gate structure GS2 may be disposed on opposite sides of the second source/drain pattern 250 in the first direction D1.

As an example, both the second gate electrodes 220 disposed on opposite sides of the second source/drain pattern 250 may be normal gate electrodes used as the gates of the transistor. As another example, the second gate electrode 220 disposed on one side of the second source/drain pattern 250 is used as the gate of the transistor, but the second gate electrode 220 disposed on the other side of the second source/drain pattern 250 may be a dummy gate electrode.

The first gate insulating film 130 may extend along the upper surface of the field insulating film 105 and the upper surface BP1_US of the first lower pattern. The first gate insulating film 130 may at least partially surround a plurality of first sheet patterns NS1. The first gate insulating film 130 may be disposed along the periphery of the first sheet pattern NS1. The first gate electrode 120 is disposed on the first gate insulating film 130. The first gate insulating film 130 is disposed between the first gate electrode 120 and the first sheet pattern NS1.

A portion of the first gate insulating film 130 may be disposed between the first sheet patterns NS1 adjacent to each other in the third direction D3, and between the first lower pattern BP1 and the first sheet pattern NS1. When the first sheet pattern NS1 includes the first upper sheet pattern and the first lower sheet pattern adjacent to each other, a portion of the first gate insulating film 130 may extend along the upper surface NS1_US of the first lower sheet pattern and the lower surface NS1_BS of the first upper sheet pattern that face each other.

The second gate insulating film 230 may extend along the upper surface of the field insulating film 205 and the upper surface BP2_US of the second lower pattern. The second gate insulating film 230 may at least partially surround a plurality of second sheet patterns NS2. The second gate insulating film 230 may be disposed along the periphery of the second sheet pattern NS2. The second gate electrode 220 is disposed on the second gate insulating film 230. The second gate insulating film 230 is disposed between the second gate electrode 220 and the second sheet pattern NS2. A portion of the second gate insulating film 230 may be disposed between the second sheet patterns NS2 adjacent to each other in the third direction D3, and between the second lower pattern BP2 and the second sheet pattern NS2.

The first gate insulating film 130 and the second gate insulating film 230 may each include a silicon oxide, a silicon oxynitride, a silicon nitride or a high dielectric constant material having a higher dielectric constant than the silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide CV lead zinc niobate.

Although the first gate insulating film 130 and the second gate insulating film 230 are each shown as being a single film, this is one particular arrangement, and the embodiment is not necessarily limited thereto. The first gate insulating film 130 and the second gate insulating film 230 may each include a plurality of films. The first gate insulating film 130 may include an interfacial layer disposed between the first sheet pattern NS1 and the first gate electrode 120, and a high dielectric constant insulating lilt and the second gate insulating film 230 may include an interfacial layer disposed between the second sheet pattern NS2 and the second gate electrode 220, and a high dielectric constant insulating film.

The semiconductor device, according to embodiments, may include an NC (Negative Capacitance) FET that uses a negative capacitor. For example, the first gate insulating film 130 and the second insulating film 230 may each include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. For example, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may thither include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Say). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not necessarily limited to, at least one of hafnium oxide, zirconium oxide, and aluminum oxide.

The ferroelectric material film and the paraelectric material film may include the same material. The ferroelectric material film has the ferroelectric properties, but the paraelectric material film might not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film having the ferroelectric properties may be of a particular thickness. A thickness of the ferroelectric material film may be, for example, but is not necessarily limited to being, from 0.5 nm to 10 nm. Since a critical thickness that exhibits the ferroelectric properties may vary for each ferroelectric material, the thickness of the ferroelectric material film may vary depending on the ferroelectric material.

As an example, the first gate insulating film 130 and the second gate insulating film 230 may each include one ferroelectric material film. As an embodiment, the first gate insulating film 130 and the second gate insulating film 230 may each include a plurality of ferroelectric material films that are spaced apart from each other. The first gate insulating film 130 and the second gate insulating film 230 may each have a stacked film structure in which the plurality of ferroelectric material films and the plurality of paraelectric material films are alternately stacked.

The first gate spacer 140 may be disposed on the side walls of the first gate electrode 120. The first gate spacer 140 is not disposed between the first lower pattern BP1 and the first sheet pattern NS1, and between the first sheet patterns NS1 adjacent to each other in the third direction D3.

The second gate spacer 240 may be disposed on the side walls of the second gate electrode 220. The second gate spacer 240 is not disposed between the second lower pattern BP2 and the second sheet pattern NS2, and between the second sheet patterns NS2 adjacent to each other in the third direction D3.

The first gate spacer 140 and the second gate spacer 240 may include, for example, at least one of silicon nitride (SiN), silicon oxynitride (SiON), silicon oxide (SiO$_2$), silicon oxycarbonitride (SiOCN), silica boronitride (SiBN), silicon oxyboronitride (SiOBN), silicon oxycarbide and combinations thereof. Although the first gate spacer 140 and the second gate spacer 240 are each shown as being a single layer, this is one particular arrangement, and the embodiment is not necessarily limited thereto.

The first gate capping pattern 145 may be disposed on the first gate electrode 120 and the first gate spacer 140. The second gate capping pattern 245 may be disposed on the second gate electrode 220 and the second gate spacer 240. The upper surface of the first gate capping pattern 145 and the upper surface of the second gate capping pattern 245 may be disposed on the same plane as the upper surface of the interlayer insulating film 190.

Unlike the shown example, the first gate capping pattern 145 may be disposed between the first gate spacers 140, and the second gate capping pattern 245 may be disposed between the second gate spacers 240.

The first gate capping pattern 145 and the second gate capping pattern 245 may each include, for example, at least one of silicon nitride (SiN), silicon oxynitride (SiON), silicon carbonitride (SiCN), silicon oxycarbonitride (SiOCN), and combinations thereof. The first gate capping pattern 145 and the second gate capping pattern 245 may include a material having an etching selectivity with respect to the interlayer insulating film 190.

The first source/drain pattern 150 may be disposed on the first active pattern AP1. The first source/drain pattern 150 may be disposed on the first lower pattern BP1. The first source/drain pattern 150 is connected to the first sheet pattern NS1. The first source/drain pattern 150 may directly contact the first sheet pattern NS1.

The first source/drain pattern 150 may be disposed on the side surface of the first gate structure GS1. The first source/drain pattern 150 may be disposed between the first gate structures GS1 adjacent to each other in the first direction D1. For example, the first source/drain pattern 150 may be disposed on opposite sides of the first gate structure GS1. Unlike the shown example, the first source/drain pattern 150 may be disposed on one side of the first gate structure GS1, and might not be disposed on the other side of the first gate structure GS1.

The second source/drain pattern 250 may be disposed on the second active pattern AP2. The second source/drain pattern 250 may be disposed on the second lower pattern BP2. The second source/drain pattern 250 is connected to the second sheet pattern NS2. The second source/drain pattern 250 may directly contact the second sheet pattern NS1.

The second source/drain pattern 250 may be disposed on the side surface of the second gate structure GS2. The second source/drain pattern 250 may be disposed between the second gate structures GS2 adjacent to each other in the first direction D1. For example, the second source/drain pattern 250 may be disposed on opposite sides of the second gate structure GS2. Unlike the shown example, the second source/drain pattern 250 may be disposed on one side of the second gate structure GS2, and might not be disposed on the other side of the second gate structure GS2.

The first source/drain pattern 150 and the second source/drain pattern 250 may be included in the source/drain of the transistor that uses the first sheet pattern NS1 and the second sheet pattern NS2 as the channel region.

The first source/drain pattern 150 may be disposed inside a first source/drain recess 150R, The second source/drain pattern 250 may be disposed inside a second source/drain recess 250R. The first source/drain recess 150R and the second source/drain recess 250R each extend in the third direction D3. The first source/drain recess 150R may be defined between the first gate structures GS1 adjacent to each other in the first direction D1. The second source/drain recess 250R may be defined between the second gate structures GS2 adjacent to each other in the second direction D2.

The bottom surface of the first source/drain recess 150R may be defined by the first lower pattern BP1. The side walls of the first source/drain recess 150R may be defined by the first sheet pattern NS1 and the first inter-gate structure GS1_INT. The bottom surface of the second source/drain recess 250R may be defined by the second lower pattern BP2. The side walls of the second source/drain recess 250R may be defined by the second sheet pattern NS2 and the second inter-gate structure GS2_INT.

The upper surface BP1_US of the first lower pattern may be a boundary between the first inter-gate structure GS1_INT disposed at the lowermost portion and the first lower pattern BP1. The bottom surface of the first source/drain recess 150R is lower than the upper surface BP1_US of the first lower pattern. Similarly, the bottom surface of the second source/drain recess 250R is lower than the upper surface BP2_US of the second lower pattern.

The side walls of the first source/drain recess 150R and the side walls of the second source/drain recess 250R may each have a wavy form.

The first source/drain recess 150R may include a plurality of first width extension regions 150R_ER. Each first width extension region 150R_ER may be defined above the upper surface BP1_US of the first lower pattern. The second source/drain recess 250R may include a plurality of second width extension regions 250R_ER. Each second width extension region 250R_ER may be defined above the upper surface BP2_US of the second lower pattern.

The first width extension region 150R_ER may be defined between the first nanosheets NS1 adjacent to each other in the third direction D3. The first width extension region 150R, may be defined between the first lower pattern BP1 and the first nanosheet NS1. The first width extension region 150R_ER may extend between the first nanosheets NS1 adjacent to each other in the third direction D3. For example, the first width extension region 150R_ER may be defined between the first nanosheets NS1 adjacent to each other in the third direction D3, and between the first inter-gate structures GS1_INT adjacent to each other in the first direction D1. The first width extension region 150R_ER may be defined between the first nanosheet NS1 and the first lower pattern BP1 adjacent to each other in the third direction D3, and between the first inter-gate structures GS1_INT adjacent to each other in the first direction D1.

Each first width extension region 150R_ER may include a portion in which the width in the first direction D1 increases and a portion in which the width in the first direction D1 decreases, in a direction away from the upper surface BP1_US of the first lower pattern. For example, the width of the first width extension region 150R_ER may increase and then decrease, in a direction away from the upper surface BP1_US of the first lower pattern.

In each first width extension region 150R_ER, a point on which the width of the first width extension region 150R_ER is maximum is disposed between the first nanosheet NS1 and the first lower pattern BP1 adjacent to each other in the third direction D3, and between the first nanosheets NS1 adjacent to each other in the third direction D3.

The above description of the first width extension region 150R_ER may be applied to the second width extension region 250R_ER.

The first source/drain pattern 150 may directly contact the first sheet pattern NS1 and the first lower pattern BP1 Since the first gate spacer 140 is not disposed between the adjacent first sheet patterns NS1 and between the first sheet pattern NS1 and the first lower pattern BP1, the first source/drain pattern 150 may directly contact the first gate insulating film 130 of the first inter-gate structure GS1_INT.

The second source/drain pattern 250 may directly contact the second sheet pattern NS2 and the second lower pattern BP2. The second source/drain pattern 250 may directly contact the second gate insulating film 230 of the second inter-gate structure GS2_INT.

The first source/drain pattern 150 may include a first semiconductor liner 150LF and a first semiconductor filling film 153.

The first semiconductor liner 150LF may extend along the side walls of the first source/drain recess 150R and the bottom surface of the first source/drain recess 150R. The first semiconductor liner 150LF may be formed continuously along the first source/drain recess 150R. The first semiconductor liner 150LF formed along the first source/ drain recess 150R defined by the first sheet pattern NS1 is directly connected to the first semiconductor liner 150LF formed along the first source/drain recess 150R defined by the first inter-gate structure GS1_INT.

The first semiconductor liner 150LF may directly contact the first gate insulating film 130, the first sheet pattern NS1, and the first lower pattern BP1.

The first semiconductor liner 150LF may include a first lower semiconductor liner 151 and a first upper semiconductor liner 152. The first upper semiconductor liner 152 is disposed on the first lower semiconductor liner 151.

The first lower semiconductor liner 151 may extend along the side walls of the first source/drain recess 150R and the bottom surface of the first source/drain recess 150R. The first lower semiconductor liner 151 may directly contact the first gate insulating film 130, the first sheet pattern NS1, and the first lower pattern BP1.

The first upper semiconductor liner 152 may extend along the side walls of the first source/drain recess 150E and the bottom surface of the first source/drain recess 150R. The first semiconductor liner 150LF may define a first liner recess 152R. The first liner recess 152R may be defined by the first upper semiconductor liner 152.

The first semiconductor filling film 153 is disposed on the first semiconductor liner 150LF. The first semiconductor filling film 153 may directly contact the first semiconductor liner 150LF. In FIG. 2, the first semiconductor filling film 153 may fill the first liner recess 1521R. The first semiconductor filling film 153 may define an outer peripheral surface of the first source/drain pattern 150.

The second source/drain pattern 250 may include a second semiconductor litter 250LF and a second semiconductor filling film 253.

The second semiconductor liner 250LF may extend along the side walls of the second source/drain recess 250R and the bottom surface of the second source/drain recess 250R. The second semiconductor liner 250LF may be formed continuously along the second source/drain recess 250R.

The second semiconductor liner 250LF may directly contact the second gate insulating film 230, the second sheet pattern NS2, and the second lower pattern BP2.

The second semiconductor liner 250LF may include a second lower semiconductor liner 251 and a second upper semiconductor liner 252. The second upper semiconductor liner 252 is disposed on the second lower semiconductor liner 251.

The second lower semiconductor liner 251 may extend along the side walls of the second source/drain recess 250R and the bottom surface of the second source/drain recess 250R. The second lower semiconductor liner 251 may directly contact the second gate insulating film 230, the second sheet pattern NS2, and the second lower pattern BP2.

The second upper semiconductor liner 252 may extend along the side walls of the second source/drain recess 250R and the bottom surface of the first source/drain recess 250R. The second semiconductor liner 250LF may define the second liner recess 252R. The second liner recess 252R may be defined by the second upper semiconductor liner 252.

The second semiconductor filling film 253 is disposed on the second semiconductor liner 250LF. The second semiconductor filling film 253 may directly contact the second semiconductor liner 250LF. In FIG. 3, the second semiconductor filling film 253 may fill the second liner recess 252R. The second semiconductor filling film 253 may define an outer peripheral surface of the second source/drain pattern 250.

The first semiconductor liner 150LF, the second semiconductor liner 250LF the first semiconductor filling film 153, and the second semiconductor filling film 253 may each include silicon germanium. The first semiconductor liner 150LF, the second semiconductor liner 250LF, the first semiconductor filling film 153, and the second semiconductor filling film 253 may each include a silicon germanium film. The first semiconductor liner 150LF and the second semiconductor liner 250LF may be a silicon germanium liner. The first semiconductor filling film 153 and the second semiconductor film 253 may be a silicon germanium filling film. The first semiconductor liner 150LF, the second semiconductor liner 250LF, the first semiconductor filling film 153, and the second semiconductor filling film 253 may include doped p-type impurities. For example, the p-type impurities may be, but is not necessarily limited to being, boron (B).

The first lower semiconductor liner 151, the first upper semiconductor liner 152, the second lower semiconductor liner 251 and the second upper semiconductor liner 252 may each include a silicon germanium film.

A germanium fraction of the first lower semiconductor liner 151 is different from a germanium fraction of the first upper semiconductor liner 152. The germanium fraction of the second lower semiconductor liner 251 is different from the germanium fraction of the second upper semiconductor liner 252.

Taking the first semiconductor liner 150LF as an example, the germanium fraction of the first lower semiconductor liner 151 is smaller than the germanium fraction of the first upper semiconductor liner 152. Alternatively, the germanium fraction of the first lower semiconductor liner 151 is greater than the germanium fraction of the first upper semiconductor liner 152.

The germanium fraction of the first semiconductor filling film 153 is greater than the germanium fraction of the first semiconductor liner 150LF. The germanium fraction of the second semiconductor filling film 253 is greater than the germanium fraction of the second semiconductor liner 250LF.

The germanium fraction of the first semiconductor filling film 153 is greater than the germanium fraction of the first lower semiconductor liner 151 and the germanium fraction of the first upper semiconductor liner 152. The germanium fraction of the second semiconductor filling film 253 is greater than the germanium fraction of the second lower semiconductor liner 251 and the germanium fraction of the second upper semiconductor liner 252.

The first source/drain pattern 150 and the second source/drain pattern 250 may include a semiconductor capping film disposed on the first semiconductor filling film 153 and the second semiconductor filling film 253 in such a case, the outer peripheral surfaces of the first source/drain pattern 150 and the second source/drain pattern 250 may be defined by the semiconductor capping film.

The first semiconductor liner 150LF and the second semiconductor liner 250LF may each include a plurality of silicon germanium films. For example, the number of silicon germanium films included in the first semiconductor liner 150LF may be the same as the number of silicon germanium films included in the second semiconductor liner 250LF. Although the first semiconductor liner 150LF and the second semiconductor liner 250LF are shown to each include two silicon germanium films, the embodiment is not necessarily limited thereto.

A thickness t11 of the first semiconductor liner 150LF on the bottom surface of the first source/drain recess 150R may be the same as a thickness t21 of the second semiconductor liner 250LF on the bottom surface of the second source/drain recess 250R. Here, the meaning of the term "same thickness" includes not only a case where the two thicknesses are exactly the same, but also where there is only a minute difference in thicknesses that may occur due to a margin in the process or a margin in measurement. For example, within 5%, 2%, 1%, 0.1% or 0.01% of each other.

For example, a thickness t11 of the first semiconductor liner 150LF may be a height from the lowermost portion of the first semiconductor liner 150LF to the lowermost portion of the first semiconductor filling film 153.

In FIGS. 2 and 3, a thickness t12 of the first semiconductor filling film 153 in the third direction D3 is smaller than a thickness t22 of the second semiconductor filling film 253 in the third direction D3. For example, the thickness 112 of the first semiconductor filling film 153 may be a height from the lowermost portion of the first semiconductor filling film 153 to the uppermost portion of the first semiconductor filling film 153 in a cross-sectional view taken in the first direction D1.

In FIGS. 2 and 3, a height (t11+t12) of the first source/drain pattern 150 is smaller than a height (t2+t22) of the second source/drain pattern 250. For example, the height (t11+t12) of the first source/drain pattern 150 may be a height from the lowermost portion of the first source/drain pattern 150 to the uppermost portion of the first source/drain pattern 150 in a cross-sectional view taken in the first direction D1.

An upper surface 153US of the first semiconductor filling film may have a concave shape between the first gate structures GS1 adjacent to each other in the first direction D1. When a first source/drain contact 180 is formed, the upper surface 153US of the first semiconductor filling film having a concave shape may be seen between the side walls of the first source/drain contact 180 and the side walls of the first gate structure GS1.

An upper surface 253US of the second semiconductor filling film may have a convex shape between the second gate structures GS2 adjacent to each other in the first direction D1. When a second source/drain contact 280 is formed, the upper surface 253US of the second semiconductor filling film having a convex shape may be seen between the side walls of the second source/drain contact 280 and the side walls of the second gate structure GS2.

When the first source/drain contact 180 and the second source/drain contact 280 are formed, in FIGS. 6 and 7, a protruding width LW11 of the first source/drain pattern protruding from the side walls BP1_SW of the first lower pattern in the second direction D2 is smaller than a protruding width LW12 of the second source/drain pattern protruding from the side walls BP2_SW of the second lower pattern in the second direction D2. The protruding width LW11 of the first source/drain pattern may be a side growth width of the first source/drain pattern 150 in the second direction D2.

A semiconductor residue pattern may be disposed between the first inter-gate structure GS1_INT and the first source/drain pattern 150. The semiconductor residue pattern may be disposed between the second inter-gate structure GS2_INT and the second source/drain pattern 250. The semiconductor residue pattern may include, for example, silicon germanium.

An air gap may be disposed between the first inter-gate structure GS1_INT and the first source/drain pattern 150. The air gap may be disposed between the second inter-gate structure GS2_INT and the second source/drain pattern 250.

The etching stop film 185 may be disposed on the side walls of the first gate structure GS1, the upper surface of the first source/drain pattern 150, and the side walls of the first source/drain pattern 150. The etching stop film 185 may be disposed on the side walls of the second gate structure GS2, the upper surface of the second source/drain pattern 250, and the side walls of the first source/drain pattern 150. The etching stop film 185 may be disposed on the upper surface of the field insulating film 105.

The etching stop film 185 may include a material having an etching selectivity with respect to the interlayer insulating film 190 to be described later. The etching stop film 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating, film 190 may be disposed on the etching stop film 185. The interlayer insulating film 190 may be disposed on the first source/drain pattern 150 and the second source/drain pattern 250. The interlayer insulating film 190 might not cover the upper surface of the first gate capping pattern 145 and the upper surface of the second gate capping pattern 245.

The interlayer insulating film 190 may include, for example, at least one of silicon oxide, silicon nitride, silicon oxynitride, and a low dielectric constant material. The low dielectric constant material may include, for example, but is not necessarily limited to, at least one of Fluorinated Tetra-EthylOrthoSilicate (FTEoS), Hydrogen SilsesQuioxane (HSQ), Bis-benzoCycloButene (BCB), TetraMethylOrtho-Silicate (TMOS) OctaMethyleyCloTetraSilexane (OMCTS), HexaMethylDiSiloxane (HMDS), TriMethyl Silyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first source/drain contact 180 is disposed on the first source/drain pattern 150. The first source/drain contact 180 is connected to the first source/drain pattern 150. The first source/drain contact 180 passes through the interlayer insulating film 190 and the etching stop film 185, and may be connected to the first source/drain pattern 150.

The second source/drain contact 280 is disposed on the second source/drain pattern 250. The second source/drain contact 280 is connected to the second source/drain pattern 250.

A first metal silicide film 175 may be further disposed between the first source/drain contact 180 and the first source/drain pattern 150. A second metal silicide film 275 may be further disposed between the second source/drain contact 280 and the second source/drain pattern 250.

Although a bottom surface of the first source/drain contact 180 is shown as being higher than the lower surface NS1_BS of the first sheet pattern disposed at the uppermost portion of the first sheet pattern NS1, the embodiment is not necessarily limited thereto. Unlike the shown example, the bottom surface of the first source/drain contact 180 may be disposed between the lower surface NS1_BS of the first sheet pattern disposed at the lowermost portion of the first sheet pattern NS1 and the lower surface NS1_BS of the first sheet pattern disposed at the uppermost portion. The description of the height of the bottom surface of the second source/drain contact 280 may be substantially the same as the description of the height of the bottom surface of the first source/drain contact 180.

Although the first source/drain contact 180 and the second source/drain contact 280 are each shown as a single film, this is one particular arrangement, and the embodiment is not necessarily limited thereto. The first source/drain contact 180 and the second source/drain contact 280 may include, for example, at least one of a metal, a metal alloy, a conductive metal nitride, a conductive metal carbide, a conductive metal oxide, a conductive metal carbonitride, and a two-dimensional material (2D material).

The first metal silicide film 175 and the second metal silicide film 275 may include a metal silicide.

Figure 9:
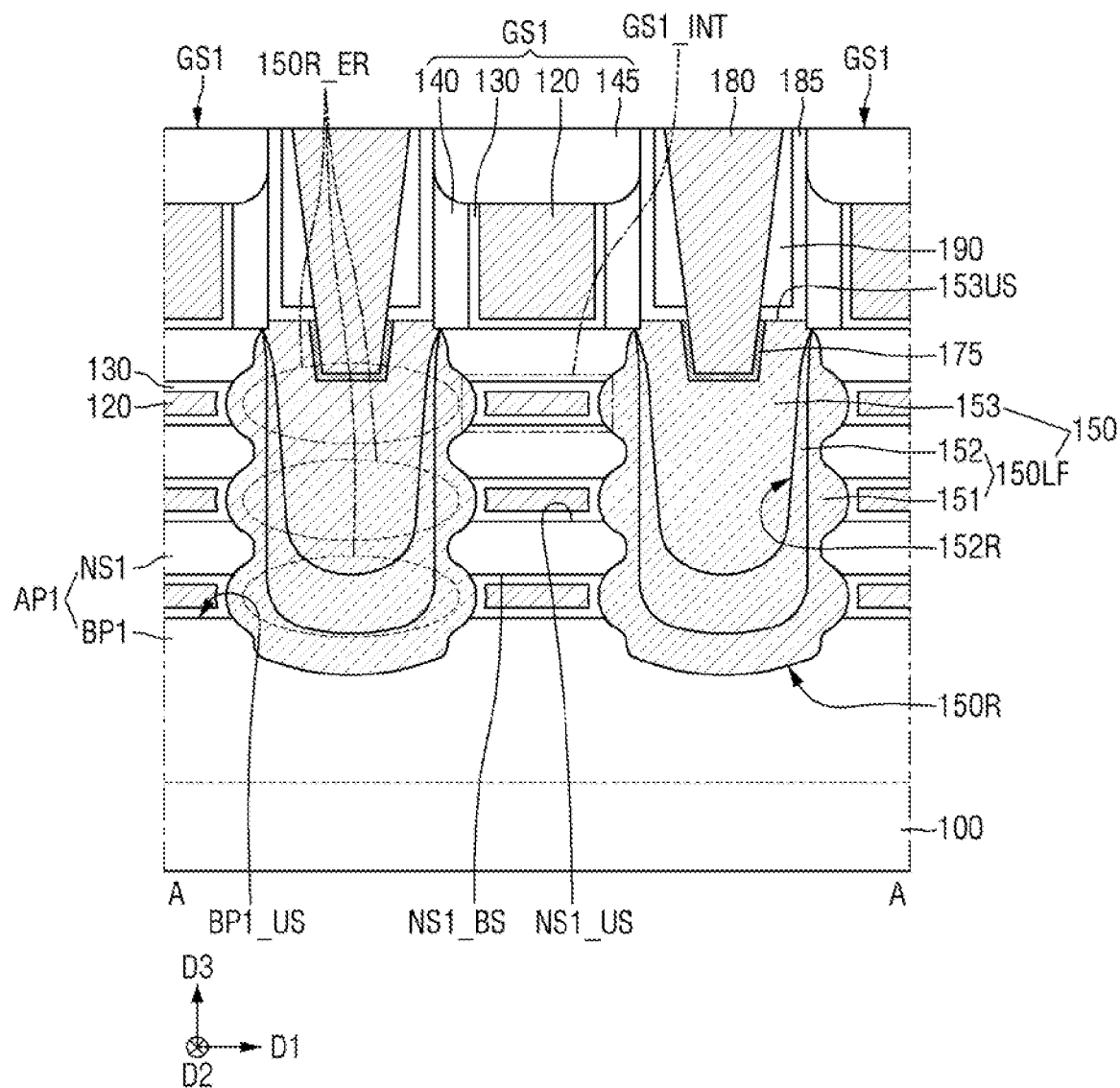
FIG. 9 is a diagram illustrating a semiconductor device, according to embodiments.
Figure 10:
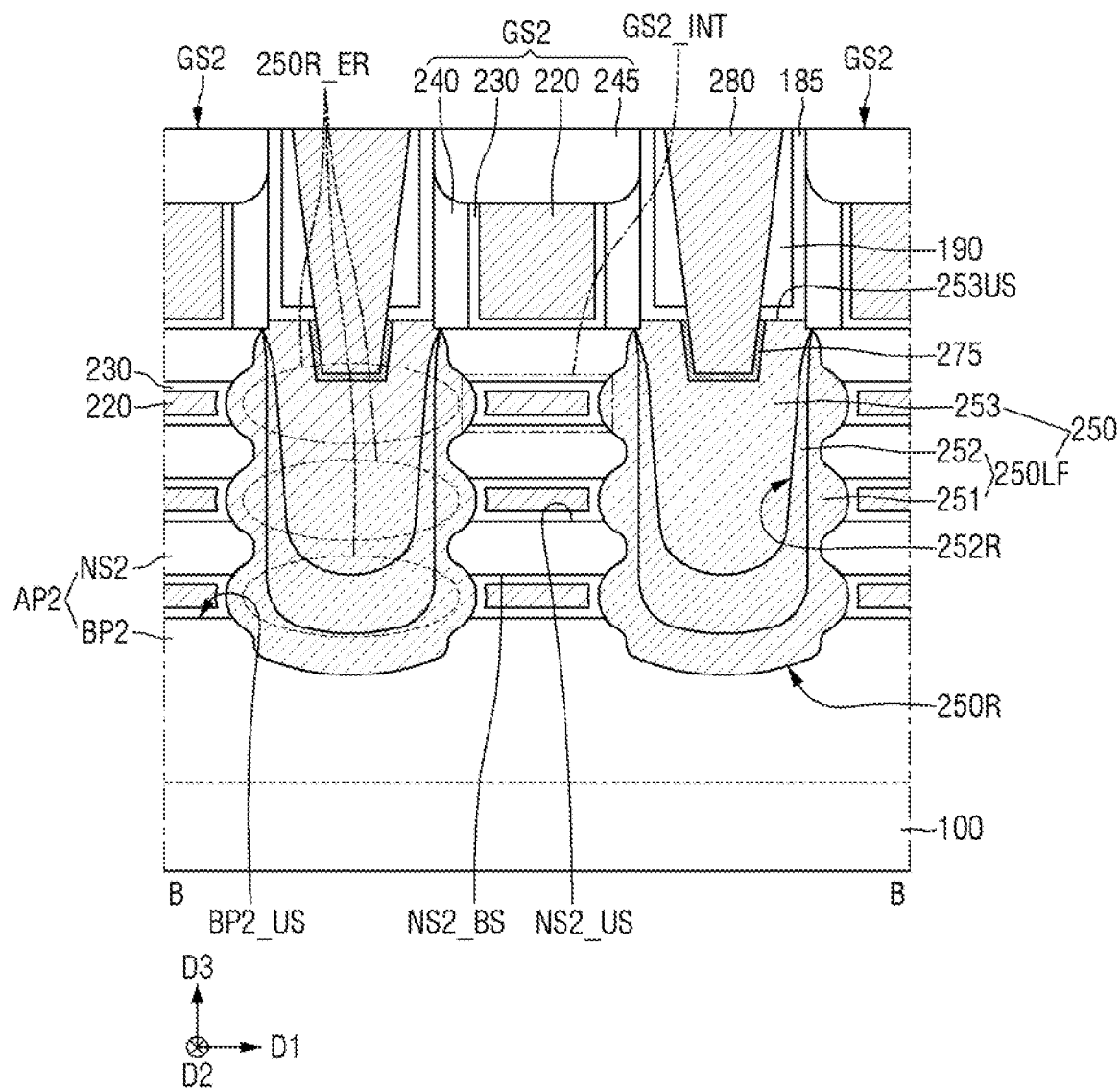
FIG. 10 is a diagram illustrating the semiconductor device, according to embodiments.

FIG. 9 is a diagram illustrating a semiconductor device, according to embodiments, FIG. 10 is a diagram illustrating the semiconductor device, according to embodiments. For convenience of explanation, the points different from those described using FIGS. 1 to 8 will be mainly described and to the extent that an element is not described in detail, it may be assumed that the element is at least similar to a corresponding element described elsewhere within the present disclosure.

Referring to FIG. 9, in the semiconductor device, according to embodiments, the upper surface 153US of the first semiconductor filling film may be planar.

The upper surface 153US of the first semiconductor filling film may be flat, between the first gate structures GS1 adjacent to each other in the first direction D1.

Referring to FIG. 10, in a semiconductor device, according to embodiments, the upper surface 253US of the second semiconductor filling film may be planar.

The upper surface 253US of the second semiconductor filling film may be flat, between the second gate structures GS2 adjacent to each other in the first direction D1.

Figure 11:
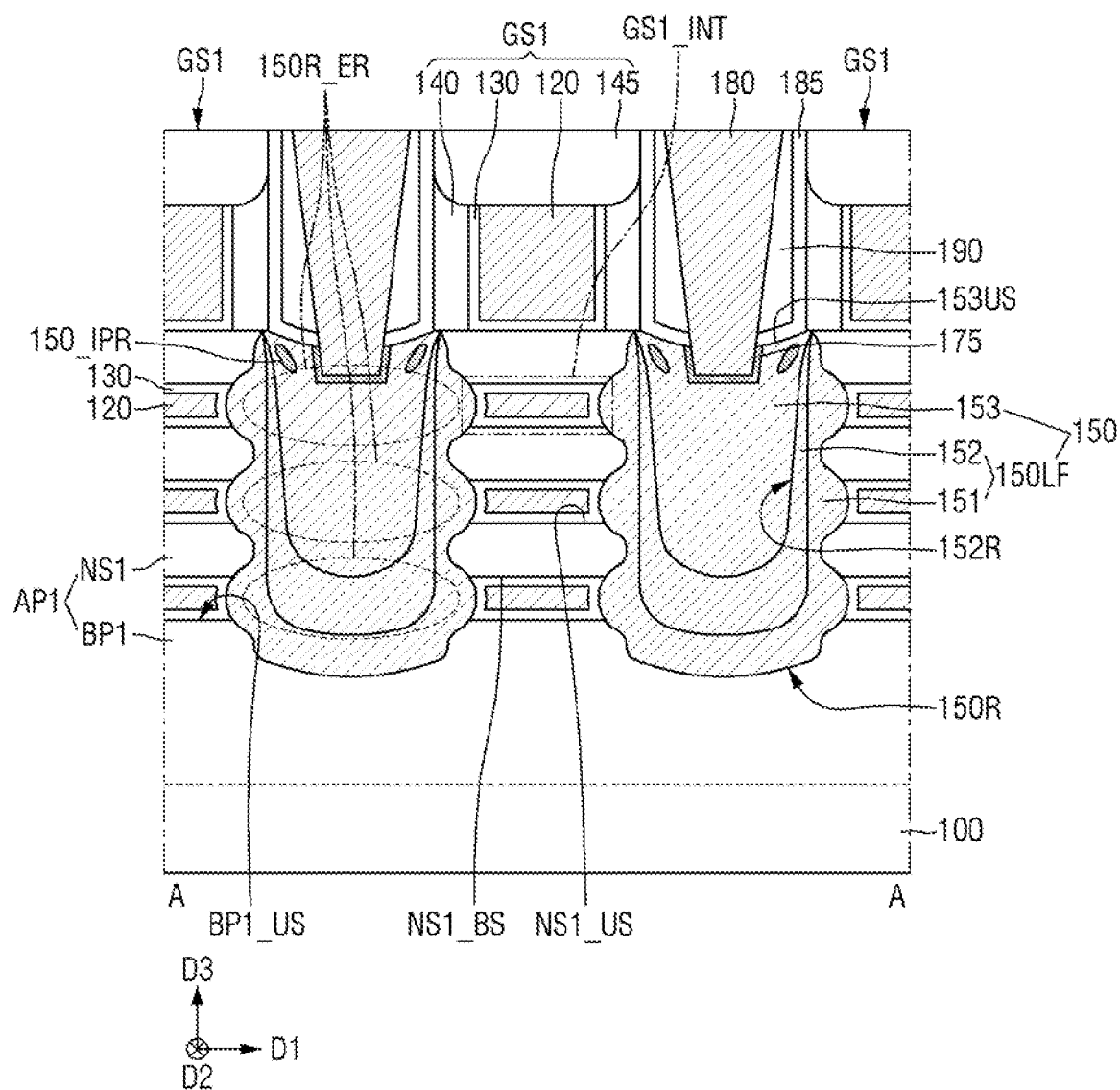
FIG. 11 is a diagram illustrating the semiconductor device, according to embodiments.

FIG. 11 is a diagram illustrating the semiconductor device according, to embodiments. For convenience of explanation, the points different from those described using FIGS. 1 to 8 will be mainly described and to the extent that an element is not described in detail, it may be assumed that the element is at least similar to a corresponding element described elsewhere within the present disclosure.

Referring to FIG. 11, in a semiconductor device, according to embodiments, the first source/drain pattern 150 may include a first impurity pile-up region 150_IPR.

The first impurity pile-up region 150_IPR may be a region in which p-type impurities are gathered. For example, the first impurity pile-up region 150_IPR, may be disposed inside of the first semiconductor filling film 153.

The first impurity pile-up region 150_IPR is located below the upper surface NS1_US of the first sheet pattern disposed at the uppermost portion. The first impurity pile-up region 150_IPR may extend in a direction that forms a predetermined angle with the first direction D1 and the third direction D3.

A concentration (e.g., expressed in units/cm$^3$) of the p-type impurities in the first impurity pile-up region 150_IPR is higher than a concentration of the p-type impurities included in the first semiconductor filling film 153.

Plane defects may be located near the location of the first impurity pile-up region 150_IPR, but are not necessarily limited thereto. The plane defects may be, for example, stacking fault.

Figure 12:
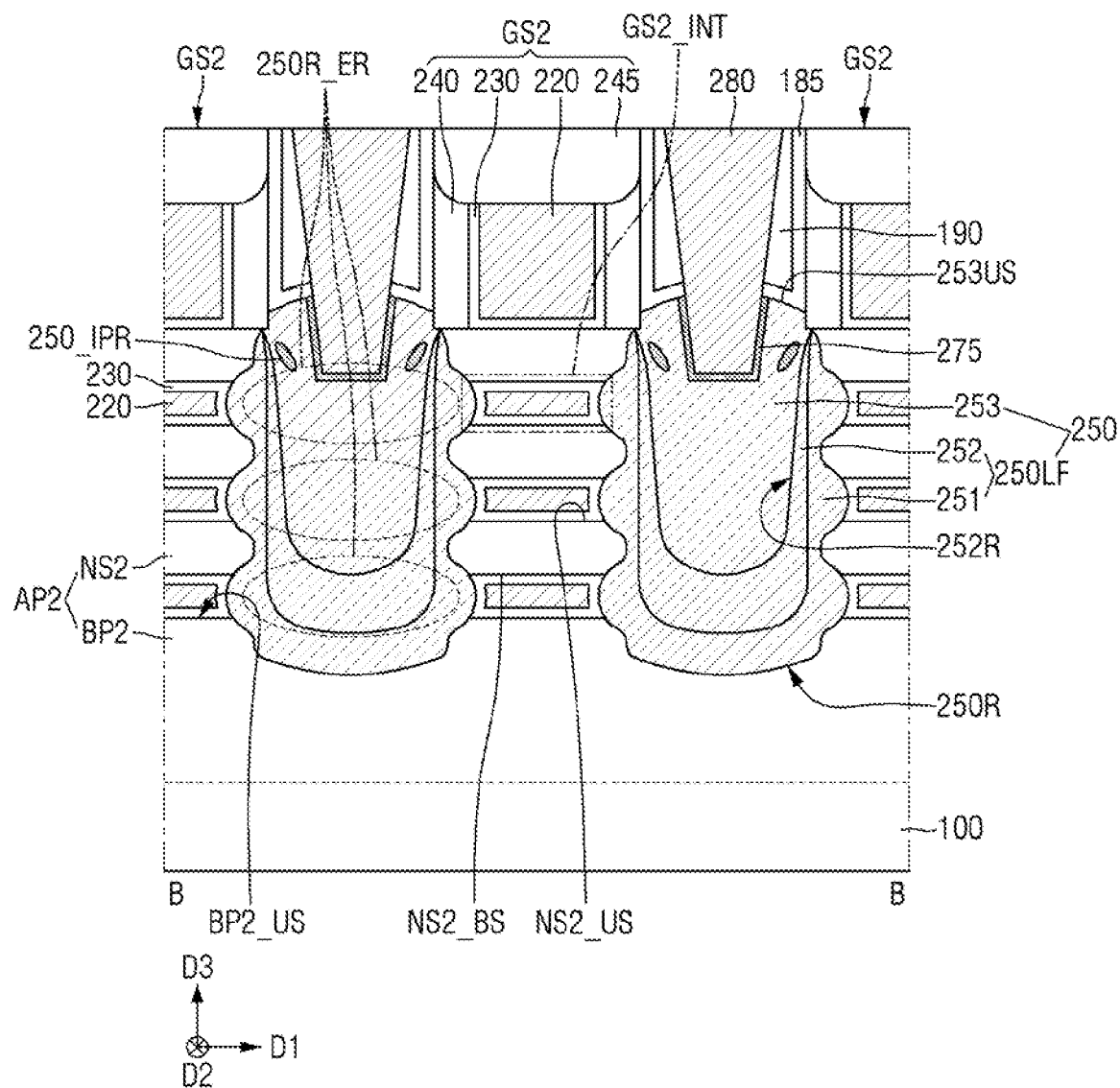
FIG. 12 is a diagram illustrating a semiconductor device, according to embodiments.
Figure 13:
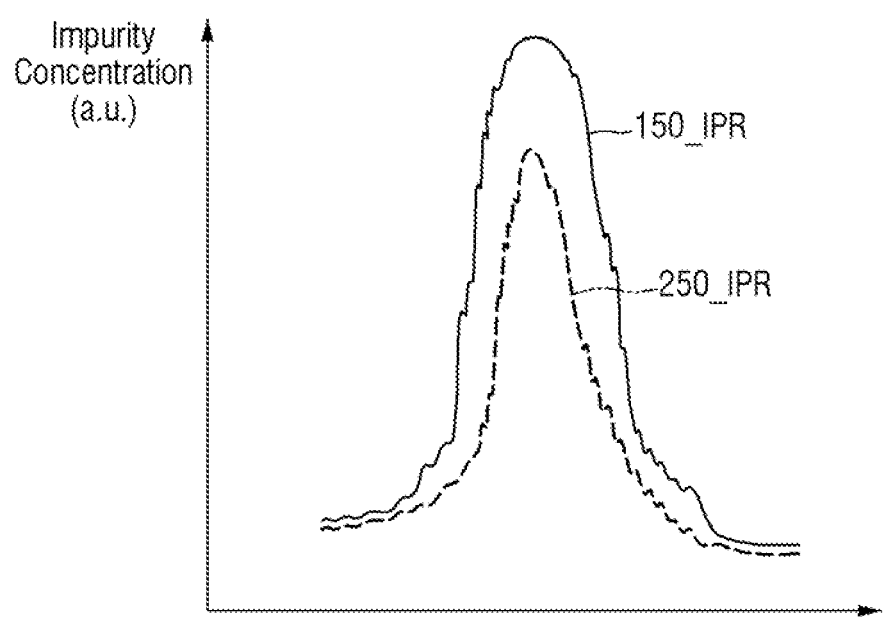
FIG. 13 is a graph comparing the concentrations of the p-type impurities in the impurity pile-up region of FIGS. 11 and 12.

FIG. 12 is a diagram illustrating a semiconductor device, according to embodiments. FIG. 13 is a graph for comparing the concentrations of the p-type impurities in the impurity pile-up region of FIGS. 11 and 12. For convenience of explanation, the points different from those described using FIGS. 1 to 8 and 11 will be mainly described and to the extent that an element is not described in detail, it may be assumed that the element is at least similar to a corresponding element described elsewhere within the present disclosure.

Referring to FIGS. 12 and 13, in the semiconductor device, according to embodiments, the second source/drain pattern 250 may include a second impurity pile-up region 250_IPR.

The second impurity pile-up region 250_IPR may be a region in which the p-type impurities are gathered. For example, the second impurity pile-up region 250_IPR may be disposed inside of the second semiconductor filling film 253.

The second impurity pile-up region 250_IPR is located below the upper surface NS2_US of the second sheet pattern disposed at the uppermost portion. The second impurity pile-up region 250_IPR may extend in a direction that forms a predetermined angle with the first direction D1 and the third direction D3.

The concentration (e.g., expressed in units/cm$^3$) of the p-type impurities in the second impurity pile-up region 250_IPR is higher than the concentration of the p-type impurities included in the second semiconductor filling film 253.

In FIG. 13, the p-type impurities may be further gathered in the first impurity pile-up region 150_IPR rather than the second impurity pile-up region 250_IPR. The concentration (e.g., expressed in units/cm$^3$) of the p-type impurities in the first impurity pile-up region 150_IPR may be higher than the concentration (e.g., expressed in units/cm$^3$) of the p-type impurities in the second impurity pile-up region 250_IPR.

Figure 14:
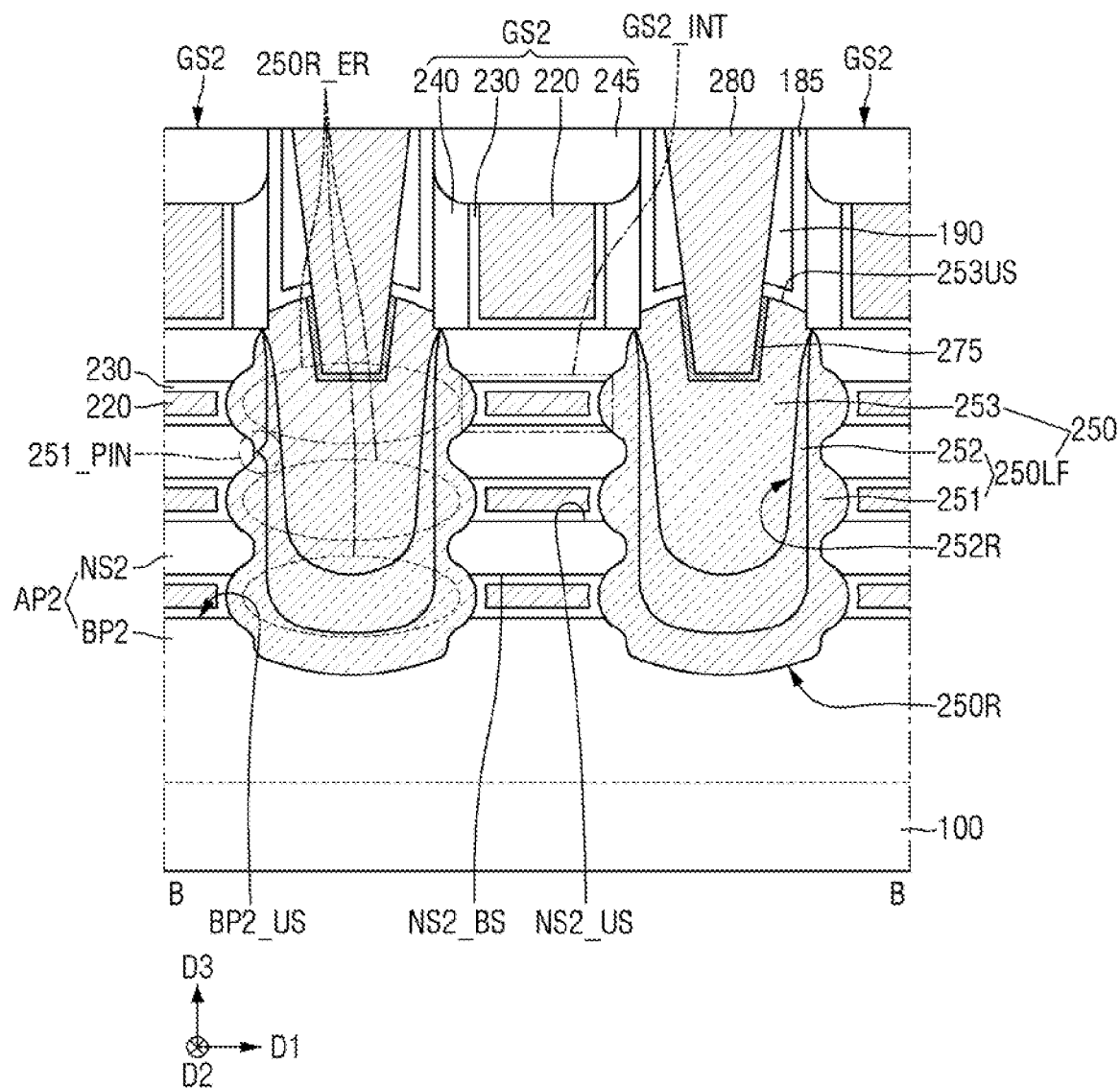
FIG. 14 is a diagram illustrating the semiconductor device, according to embodiments.

FIG. 14 is a diagram illustrating the semiconductor device, according to embodiments. For convenience of explanation, the points different from those described using FIGS. 1 to 8 will be mainly described and to the extent that an element is not described in detail, it may be assumed that the element is at least similar to a corresponding element described elsewhere within the present disclosure.

Referring to FIG. 14, in a semiconductor device, according to embodiments, the second semiconductor liner 250LF may include a pinning region 251_PIN.

The second semiconductor liner 250LF extending along the side walls of the second source/drain recess 250R may include a pinning, region 251_PIN. The pinning region 251_PIN is formed at a position where it overlaps the second sheet pattern NS2 in the first direction D1.

For example, the second lower semiconductor liner 251 extending along the side walls of the second source/drain recess 250R may include the pinning region 251_PIN. The second upper semiconductor liner 252 may fill the pinning region 251_PIN included in the second lower semiconductor liner 251. The pinning region 251_PIN may be an internal pinning region formed inside of the second semiconductor liner 250LF.

In the pinning region 251_PIN, the thickness of the second lower semiconductor liner 251 may sharply decrease. In the pinning region 251_PIN, the thickness of the second lower semiconductor liner 251 decreases and then increases in a direction away from the second lower pattern BP2.

Although one second lower semiconductor liner 251 is shown to include one pinning region 251_PIN, the embodiment is not necessarily limited thereto. One second lower semiconductor liner 251 may include a plurality of pinning regions 251_PIN.

Although a portion of the second source/drain pattern 250 is shown to include the pinning region 251_PIN and the rest of the second source/drain pattern 250 is shown to include no pinning region 251_PIN, the embodiment is not necessarily limited thereto.

Figure 15:
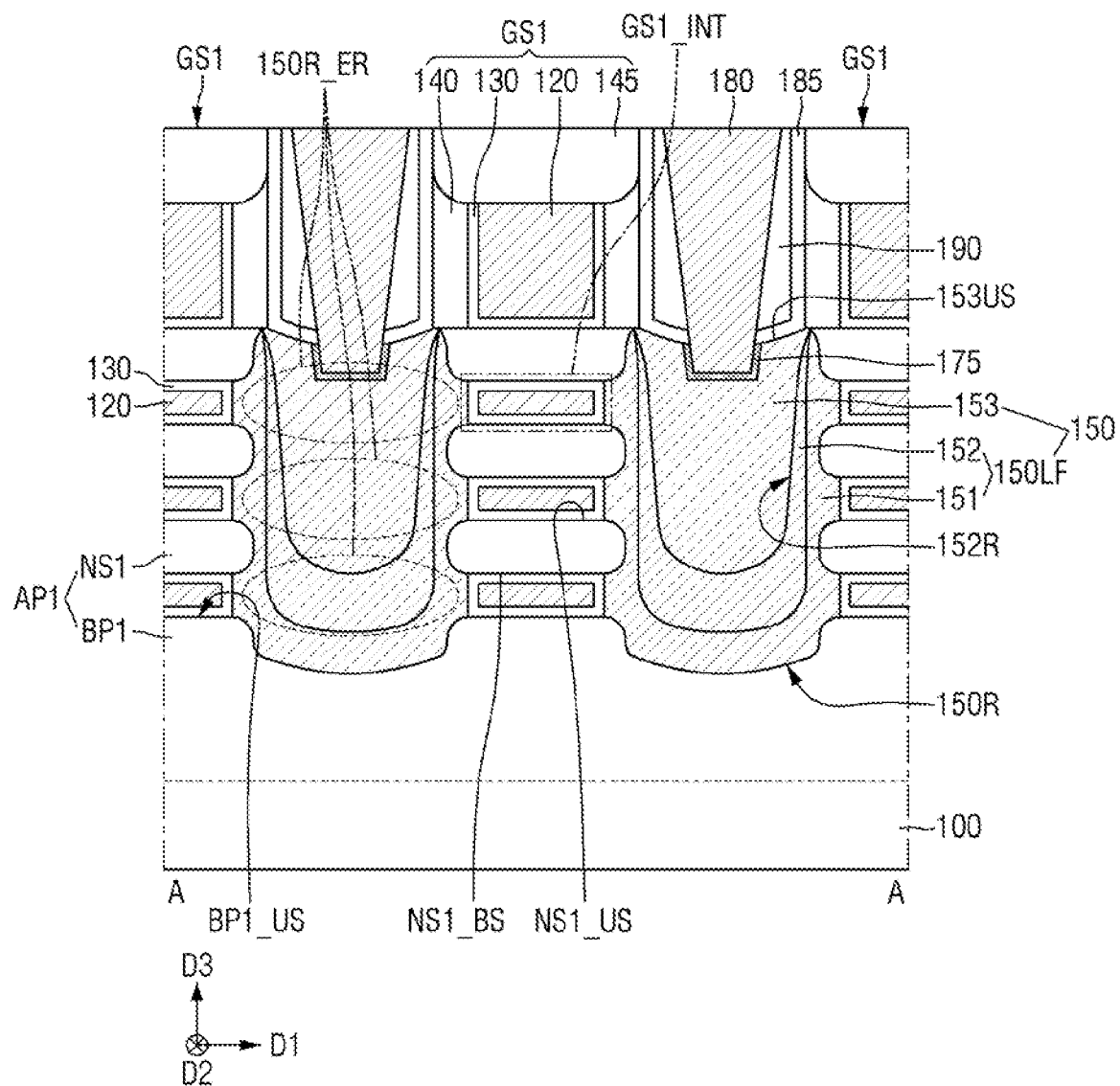
FIG. 15 is a diagram illustrating the semiconductor device, according to embodiments.
Figure 16:
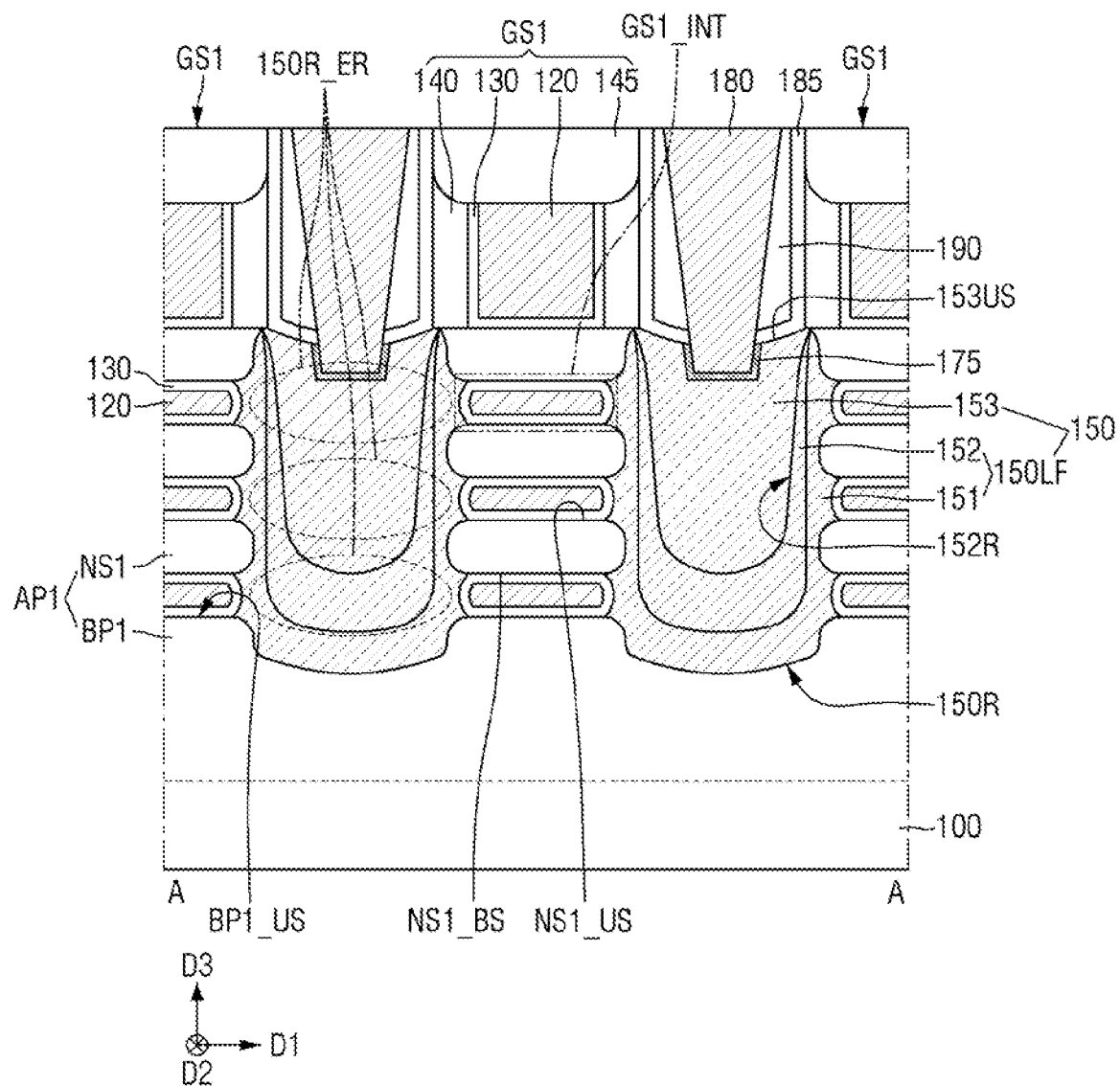
FIG. 16 is a diagram illustrating the semiconductor device, according to embodiments.
Figure 17:
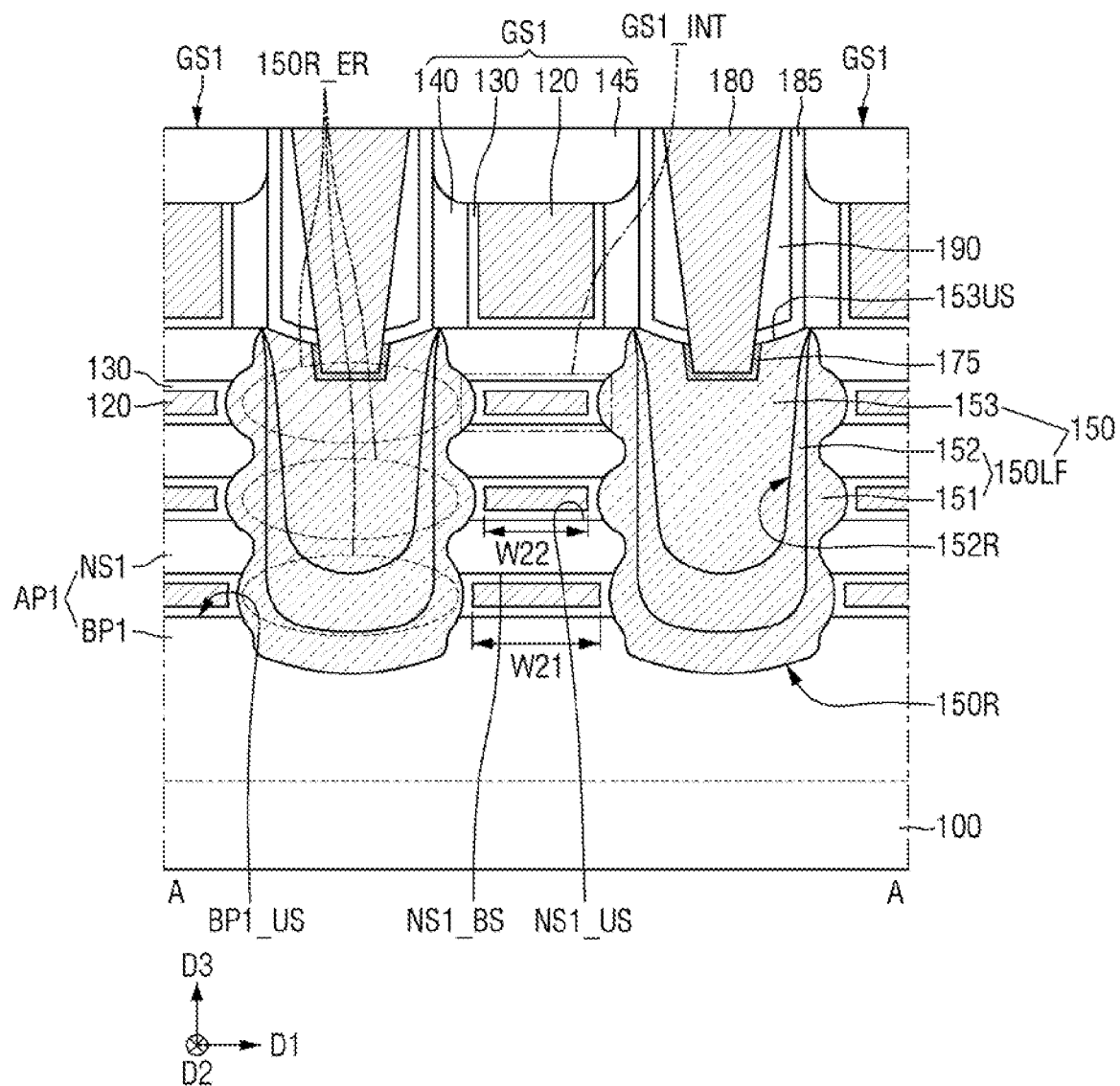
FIG. 17 is a diagram illustrating the semiconductor device, according to embodiments.
Figure 18:
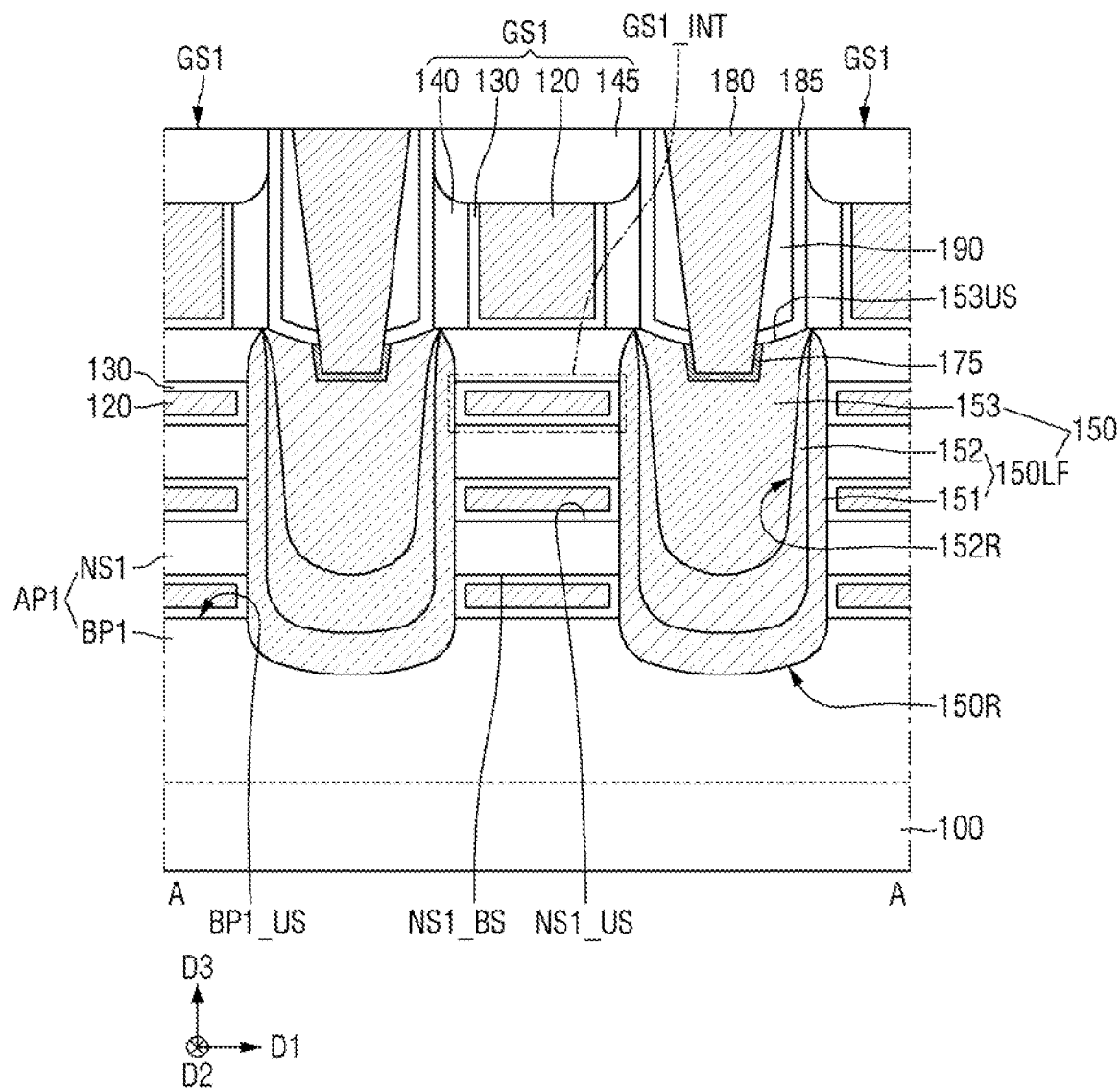
FIG. 18 is a diagram illustrating the semiconductor device, according to embodiments.
Figure 19:
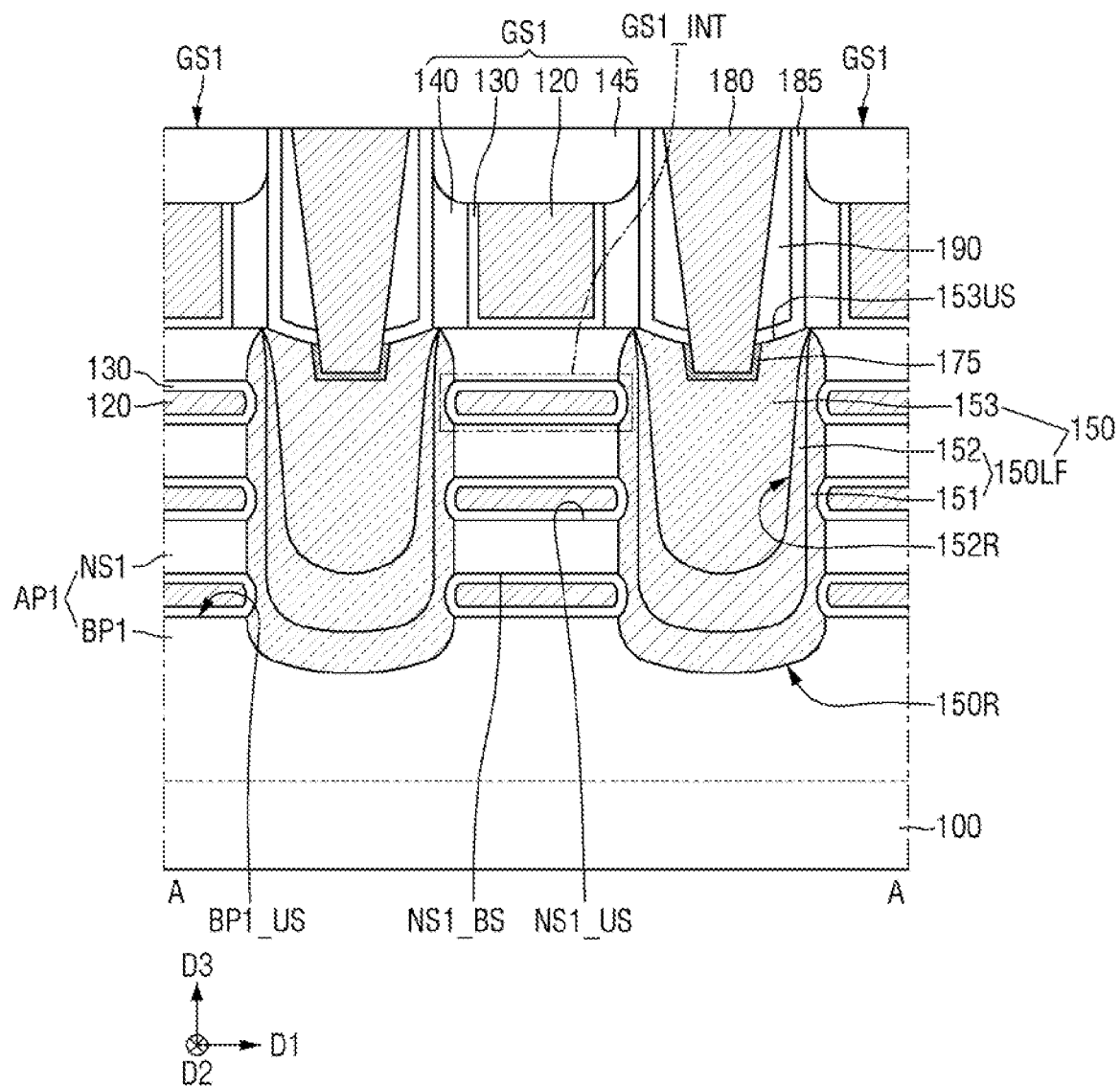
FIG. 19 is a diagram illustrating the semiconductor device, according to embodiments.

FIG. 15 is a diagram illustrating the semiconductor device, according to embodiments. FIG. 16 is a diagram illustrating the semiconductor device, according to embodiments. FIG. 17 is a diagram illustrating the semiconductor device, according to embodiments. FIG. 18 is a diagram illustrating the semiconductor device, according to embodiments. FIG. 19 is a diagram illustrating the semiconductor device, according to embodiments. For convenience of explanation, the points different from those described using FIGS. 1 to 8 will be mainly described and to the extent that an element is not described in detail, it may be assumed that the element is at least similar to a corresponding element described elsewhere within the present disclosure.

For reference, FIGS. 15 to 19 show cross-sectional views taken along A-A of FIG. 1, but the contents described using FIGS. 15 to 19 is also applicable to the cross-sectional view taken along B-B of FIG. 1.

Referring to FIG. 15, in a semiconductor device, according to embodiments, a boundary between the first gate insulating film 130 of the first inter-gate structure GS1_INT and the first semiconductor liner 150LF may be flat.

In the cross-sectional view taken along the first direction D1 in which the first lower pattern BP1 extends, the boundary between the first inter-gate structure GS1_INT and the first semiconductor liner 150LF may be planar.

The width of the first width extension region 150R_ER may increase and then be kept constant, in a direction away from the upper surface BP1_US of the first lower pattern. Further, the width of the first width extension region 150R_ER may be kept constant and then decrease, in a direction away from the upper surface BP1_US of the first lower pattern.

Referring to FIG. 16, in a semiconductor device, according to embodiments, the boundary between the first gate insulating film 130 of the first inter-gate structure GS1_INT and the first semiconductor liner 150LF may be a concave curved surface.

In the cross-sectional view taken along the first direction D1 in which the first lower pattern BP1 extends, the first inter-gate structure GS1_INT may protrude toward the first semiconductor liner 150LF, similarly to the first sheet pattern NS1. However, the first inter-gate structure GS1_INT does not protrude from an end (NS1_SW1 of FIG. 8) of the first sheet pattern NS1.

The width of the first width extension region 150R_ER may increase and then decrease, and increase and then decrease again, in a direction away from the upper surface BP1_US of the first lower pattern.

Referring to FIG. 17, in the semiconductor device, according to embodiments, a first gate width W21 of the first gate electrode 120 disposed between the first lower pattern BS1 and the first sheet pattern NS1 is greater than a second gate width W22 of the first gate electrode 120 disposed between the first sheet patterns NS1 adjacent to each other in the third direction D3.

The width in the first direction D1 of the first gate electrode 120 disposed at the lowermost portion among the first gate electrodes 120 included in the first inter-gate structure GS1_INT may be the greatest.

Referring to FIG. 18, in a semiconductor device, according to embodiments, the first source/drain recess 150R does not include a plurality of first width extension regions (150R_ER of FIG. 2).

The side walls of the first source/drain recess 150R do not have a wavy form. The width of the upper portions of the side walls of the first source/drain recess 150R in the first direction D1 may decrease, in a direction away from the first lower pattern BP1.

Referring to FIG. 19, in a semiconductor device, according to embodiments, the first inter-gate structure GS1_INT may protrude in the first direction D1 toward the first source/drain pattern 150 from the end of at least one or more first sheet patterns NS1.

For example, the first inter-gate structure GS1_INT may include a first upper inter-gate structure and a first lower inter-gate structure. The first sheet pattern NS1 may include a first insertion sheet pattern disposed between the first upper inter-gate structure and the first lower inter-gate structure. In such a case, a portion of the first upper inter-gate structure and a portion of the first lower inter-gate structure protrude from the end of the first insertion sheet pattern toward the first source/drain pattern 150.

Figure 20:
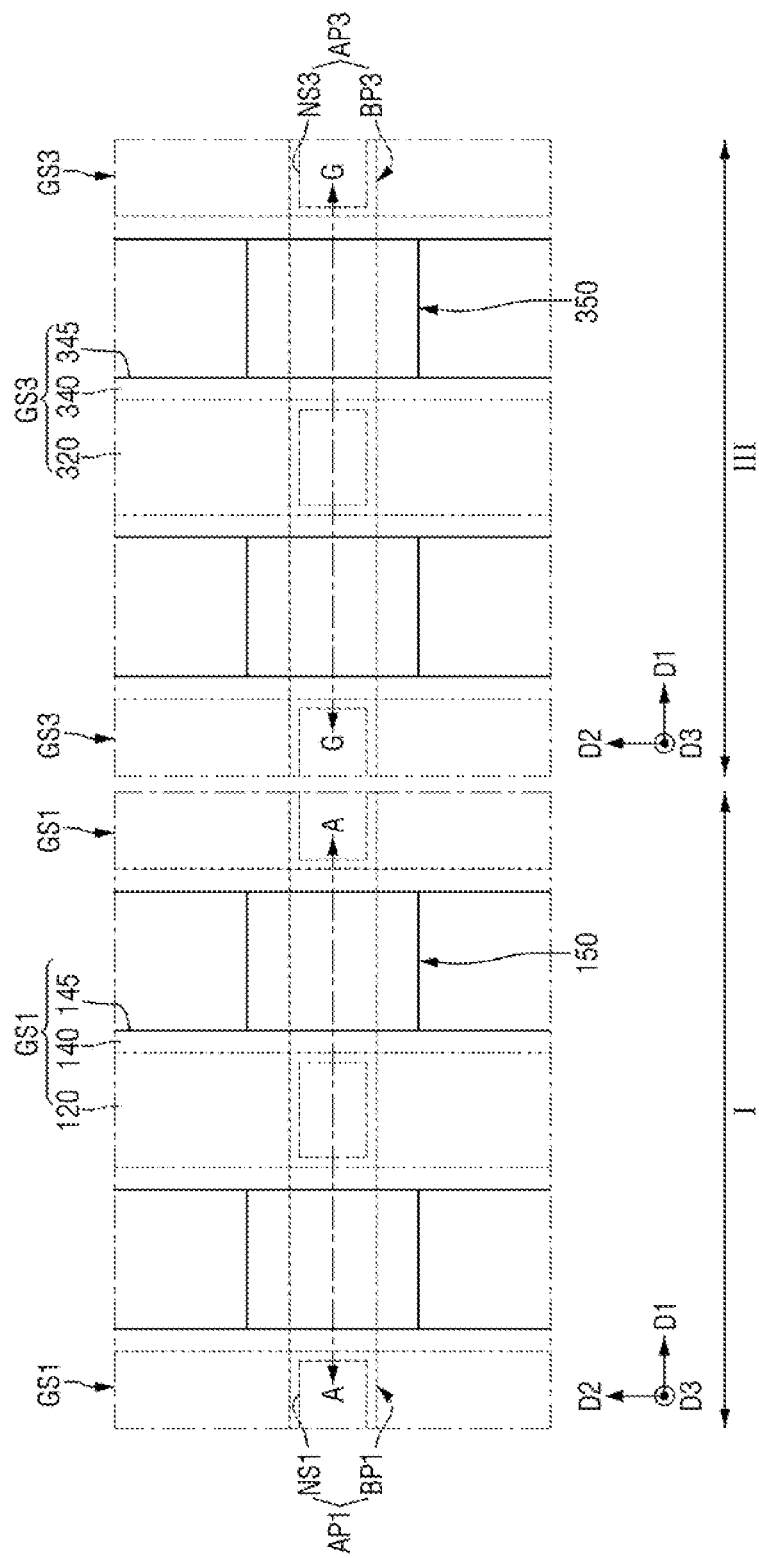
FIGS. 20 to 22 are diagrams illustrating a semiconductor device, according to embodiments.
Figure 21:
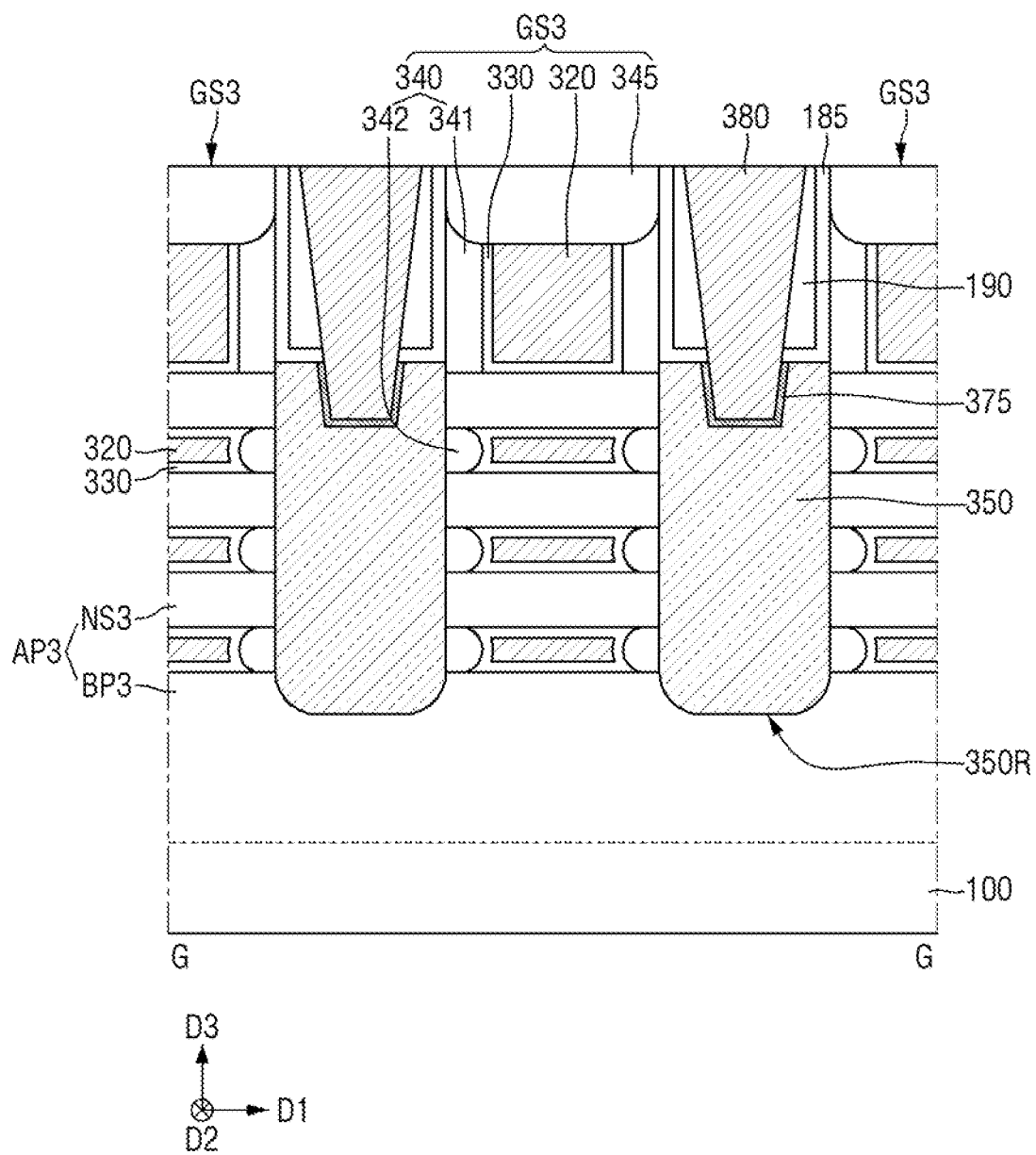
Figure 22:
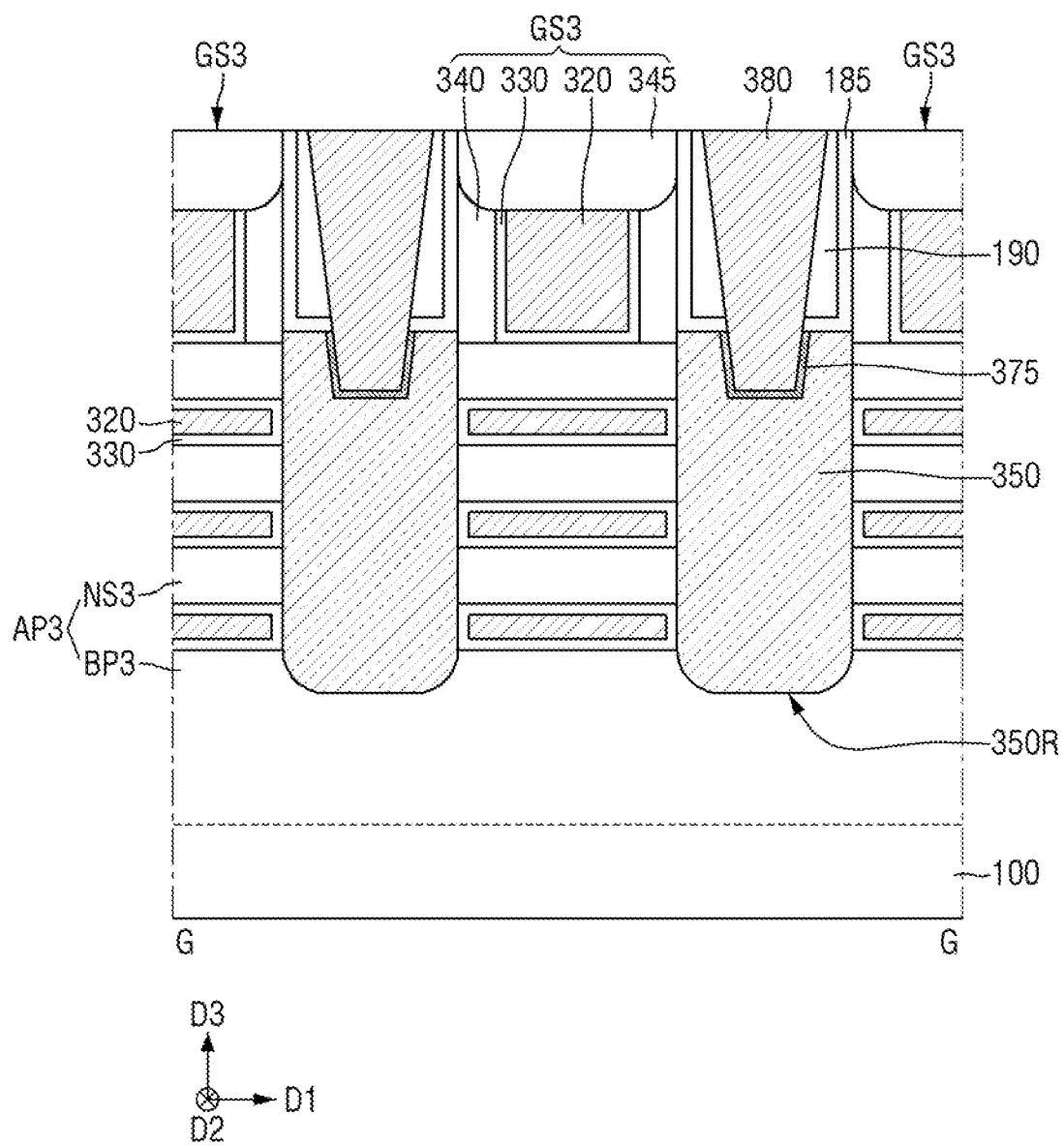

FIGS. 20 to 22 are diagrams illustrating a semiconductor device, according to embodiments. For reference, FIG. 20 is an exemplary plan view illustrating a semiconductor device, according to embodiments. FIGS. 21 and 22 are cross-sectional views taken along a line G-G of FIG. 20.

FIG. 20 shows, but is not necessarily limited to, a first region I and a third region III. Thus, FIG. 20 may be seen as showing a second region II of FIG. 1 instead of the first region I of FIG. 1.

The cross-sectional view taken along A-A of FIG. 20 may be one of the diagrams described using FIGS. 2, 9, 11, and 15 to 19. When the second region II of FIG. 1 is shown instead of the first region I of FIG. 1, the cross-sectional views taken along the B-B of FIG. 20 may be one of the drawings described using FIGS. 3, 10, 12, and 14 to 19.

In addition, the description of the first region I of FIG. 20 may be substantially the same as that described using FIGS. 1 to 19. Therefore, the following description will be provided mainly on the basis of the contents relating to the third region of FIG. 20.

Referring to FIGS. 20 to 22, the semiconductor device, according to embodiments, may include a first active pattern AP1, a plurality of first gate structures GS1, a first source/drain pattern 150, a three active pattern AP3, a plurality of third gate structures GS3, and a third source/drain pattern 350.

The substrate 100 may include a first region I and a third region III. The first region I may be a region in which a PMOS is formed, and the third region III may be a region in which an NMOS is formed.

The first active pattern AP1, the plurality of first gate structures GS1, and the first source/drain pattern 150 are disposed in the first region I of the substrate 100. The third active pattern AP3, the plurality of third gate structures GS3, and the third source/drain pattern 350 are disposed in the third region of the substrate 100.

The third active pattern AP3 may include a third lower pattern BP3 and a plurality of third sheet patterns NS3. The plurality of third sheet patterns NS3 may be separated from the third lower pattern BP3 in the third direction D3. The third lower pattern BP3 and the third sheet pattern NS3 may each include one of silicon or germanium which is an elemental semiconductor material, a group IV-IV compound semiconductor, or a group compound semiconductor. In the semiconductor device, according to embodiments, the third lower pattern BP3 may be a silicon lower pattern including silicon, and the third sheet pattern NS3 may be a silicon sheet pattern including silicon.

A plurality of third gate structures GS3 may be disposed on the substrate 100. The third gate structure GS3 may be disposed on the third active pattern AP3. The third gate structure GS3 may intersect the third active pattern AP3. The third gate structure GS3 may intersect the third lower pattern BP3 The third gate structure GS3 may at least partially surround each third sheet pattern NS2. The third gate structure GS3 may include, for example, a third gate electrode 320, a third gate insulating film 330, a third gate spacer 340, and a third gate capping pattern 345.

In FIG. 21, the third gate spacer 340 may include an outer spacer 341 and an inner spacer 342, unlike the first gate spacer 140. The inner spacer 342 may be disposed between the third sheet patterns NS3 adjacent to each other in the third direction D3. The inner spacer 342 may directly contact the third gate insulating film 330. The inner spacer 342 may define a portion of a third source/drain recess 350R.

In FIG. 22, the third gate spacer 340 does not include an inner spacer, as in the first gate spacer 140. For example, the third gate insulating film 330 may directly contact the third source/drain pattern 350.

The description of the third gate electrode 320, the third gate insulating film 330, the third gate spacer 340, and the third gate capping pattern 345 may be substantially the same as the description of the first gate electrode 120, the first gate insulating film 130 the first gate spacer 140, and the first gate capping pattern 145.

The third source/drain pattern 350 may be formed on the third active pattern AP3. The third source/drain pattern 350 may be formed on the third lower pattern BP3. The third source/drain pattern 350 may be connected to the third sheet pattern NS2. The third source/drain pattern 350 may be included in the source/drain of a transistor that uses the third sheet pattern NS3 as a channel region.

The third source/drain pattern 350 may be disposed inside of the third source/drain recess 350R. A bottom surface of the third source/drain recess 350R may be defined by the third lower pattern BP3. The side walls of the third source/drain recess 350R may be defined by a third nanosheet NS3 and a third gate structure GS3.

The third source/drain pattern 350 may include silicon doped with n-type impurities. The n-type impurities may include, for example, but are not necessarily limited to, at least one of phosphorus (P), arsenic (As), antimony (Sb) and bismuth (Bi).

As shown in FIG. 22, when the third source/drain pattern 350 directly contacts the third gate insulating film 330, the third source/drain pattern 350 may include a silicon germanium liner extending along the profile of the third source/drain recess 350R, unlike that described above. The third source/drain pattern 350 may include silicon doped with n-type impurities, on the silicon germanium liner.

A third source/drain contact 380 is disposed on the third source/drain pattern 350. The third source/drain contact 380 is connected to the third source/drain pattern 350. A third metal silicide film 375 may be further disposed between the third source/drain contact 380 and the third source/drain pattern 350.

In concluding the detailed description, those skilled in the art will appreciate that many variations and modifications may be made to the described embodiments without substantially departing from the principles of the present disclosure.

What is claimed is:

1. A semiconductor device, comprising:
a first active pattern including a first lower pattern extending in a first direction, and a first sheet pattern disposed on the first lower pattern;
a plurality of first gate structures including a first gate electrode that at least partially surrounds the first sheet pattern on the first lower pattern, the first gate electrode extending in a second direction;
a second active pattern including a second lower pattern extending in the first direction, and a second sheet pattern disposed on the second lower pattern;
a plurality of second gate structures including a second gate electrode that at least partially surrounds the second sheet pattern on the second lower pattern, the second gate electrode extending in the second direction;
a first source/drain recess defined between proximate gate structures, of the plurality of first gate structures, in the first direction;
a second source/drain recess defined between proximate gate structures, of the plurality of second gate structures, in the first direction;
a first source/drain pattern including a first silicon germanium liner extending along side walls and a bottom surface of the first source/drain recess, and a first silicon germanium filling film disposed on the first silicon germanium liner; and
a second source/drain pattern including a second silicon germanium liner extending along side walls and a bottom surface of the second source/drain recess, and a second silicon germanium filling film disposed on the second silicon germanium liner,
wherein a width of an upper surface of the first lower pattern in the second direction is smaller than a width of an upper surface of the second lower pattern in the second direction, and
wherein a thickness of the first silicon germanium filling film is smaller than a thickness of the second silicon germanium filling film.

2. The semiconductor device of claim 1, wherein a thickness of the first silicon germanium liner on the bottom surface of the first source/drain recess is substantially equal to a thickness of the second silicon germanium liner on the bottom surface of the second source/drain recess.

3. The semiconductor device of claim 2, wherein the first silicon germanium liner and the second silicon germanium liner each include a plurality of films.

4. The semiconductor device of claim 1, wherein a height of the first source/drain pattern is smaller than a height of the second source/drain pattern.

5. The semiconductor device of claim 1, wherein an upper surface of the first silicon germanium filling film has a concave shape, and an upper surface of the second silicon germanium filling film has a convex shape.

6. The semiconductor device of claim 1, wherein the upper surface of the first silicon germanium filling film is planar, and the upper surface of the second silicon germanium filling film has a convex shape.

7. The semiconductor device of claim 1, wherein the upper surface of the first silicon germanium filling film has a concave shape, and the upper surface of the second silicon germanium filling film is planar.

8. The semiconductor device of claim 1, wherein the first source/drain pattern includes a first impurity pile-up region in which p-type impurities are gathered.

9. The semiconductor device of claim 8, wherein the second source/drain pattern includes a second impurity pile-up region in which p-type impurities are gathered, and
wherein a concentration of the p-type impurities in the first impurity pile-up region, by mass or volume, is greater than the concentration of the p-type impurities in the second impurity pile-up region, by mass or volume.

10. The semiconductor device of claim 1, wherein the first source/drain recess includes a plurality of width extension regions, and
wherein a width of each width extension region in the first direction increases and then decreases, in a direction away from the upper surface of the first lower pattern.

11. The semiconductor device of claim 10, wherein a point on which the width of the width extension region in the first direction is greatest is disposed between the first lower pattern and the first sheet pattern, and
wherein the first lower pattern and the first sheet pattern are spaced apart from each other in a third direction.

12. The semiconductor device of claim 1, wherein the second silicon germanium liner extending along the side walls of the second source/drain recess includes a pinning region, and
wherein, in the pinning region, a thickness of the second semiconductor liner decreases and then increases, in a direction away from the second lower pattern.

13. The semiconductor device of claim 1, wherein a distance between the first gate electrode and an additional first gate electrode adjacent to the first gate electrode in the first direction is equal to a distance between the second gate electrode and an additional second gate electrode adjacent to the second gate electrode, each other in the first direction.

14. A semiconductor device, comprising:
a first active pattern including a first lower pattern extending in a first direction, and a first sheet pattern disposed on the first lower pattern;
a plurality of first gate structures including a first gate electrode that at least partially surrounds the first sheet pattern on the first lower pattern, the first gate electrode extending in a second direction;
a second active pattern including a second lower pattern extending in the first direction, and a second sheet pattern disposed on the second lower pattern;
a plurality of second gate structures including a second gate electrode that at least partially surrounds the second sheet pattern on the second lower pattern, the second gate electrode extending in the second direction;
a first source/drain recess defined between proximate gate structures, of the plurality of first gate structures, in the first direction;
a second source/drain recess defined between proximate gate structures, of the plurality of second gate structures, in the first direction;
a first source/drain pattern including a first silicon germanium liner extending along side walls and a bottom surface of the first source/drain recess, and a first silicon germanium filling film disposed on the first silicon germanium liner; and
a second source/drain pattern including a second silicon germanium liner extending along side walls and a bottom surface of the second source/drain recess, and a second silicon germanium filling film disposed on the second silicon germanium liner, wherein a width of an upper surface of the first lower pattern in the second direction is smaller than a width of the upper surface of the second lower pattern in the second direction, wherein a height of the first source/drain pattern is smaller than a height of the second source/drain pattern, wherein, in a cross-sectional view taken in the first direction, an upper surface of the first source/drain pattern is planar or has a concave shape, and wherein, in the cross-sectional view taken in the first direction, an upper surface of the second source/drain pattern has a convex shape.

15. The semiconductor device of claim 14, wherein a thickness of the first silicon germanium filling film is smaller than a thickness of the second silicon germanium filling film.

16. The semiconductor device of claim 14, wherein a thickness of the first silicon germanium liner on the bottom surface of the first source/drain recess is substantially equal to a thickness of the second silicon germanium liner on the bottom surface of the second source/drain recess.

17. The semiconductor device of claim 14, wherein the first source/drain pattern includes a first impurity pile-up region in which p-type impurities gathered.

18. The semiconductor device of claim 17, wherein the second source/drain pattern includes a second impurity pile-up region in which p-type impurities are gathered, and
wherein a concentration of the p-type impurities, by mass or by volume, in the first impurity pile-up region is greater than a concentration of the p-type impurities, by mass or by volume, in the second impurity pile-up region.

19. A semiconductor device, comprising:
a first active pattern including a first lower pattern extending in a first direction, and a first sheet pattern disposed on the first lower pattern;
a plurality of first gate structures including a first gate electrode that at least partially surrounds the first sheet pattern on the first lower pattern, the first gate electrode extending in a second direction;
a second active pattern including a second lower pattern extending in the first direction, and a second sheet pattern disposed on the second lower pattern;
a plurality of second gate structures including a second gate electrode that at least partially surrounds the second sheet pattern on the second lower pattern, the second gate electrode extending in the second direction;
a first source/drain recess defined between proximate gate structures, of the plurality of first gate structures, in the first direction, the first source/drain recess including a plurality of first width extension regions; and
a second source/drain recess defined between proximate gate structures, of the plurality of second gate structures, in the first direction, the second source/drain recess including a plurality of second width extension regions;
a first source/drain pattern including a first silicon germanium liner extending along side walls and a bottom surface of the first source/drain recess, and a first silicon germanium filling film disposed on the first silicon germanium liner; and
a second source/drain pattern including a second silicon germanium liner extending along side walls and a bottom surface of the second source/drain recess, and a second silicon germanium filling film disposed on the second silicon germanium liner,
wherein a width of an upper surface of the first lower pattern in the second direction is smaller than a width of the upper surface of the second lower pattern in the second direction,
wherein a width of each of the first width extension regions in the first direction increases and then decreases, in a direction away from the upper surface of the first lower pattern,
wherein a width of each of the second width extension regions in the first direction increases and then decreases, in a direction away from the upper surface of the second lower pattern,
wherein a height of the first source/drain pattern is smaller than a height of the second source/drain pattern,
wherein a thickness of the first silicon germanium liner on the bottom surface of the first source/drain recess is substantially equal to a thickness of the second silicon germanium liner on the bottom surface of the second source/drain recess, and
wherein a width of the first source/drain pattern protruding in the second direction from the side walls of the first lower pattern is smaller than a width of the second source/drain pattern protruding in the second direction from the side walls of the second lower pattern.

20. The semiconductor device of claim 19, wherein the upper surface of the first silicon germanium filling film has a concave shape, and the upper surface of the second silicon germanium filling film has a convex shape.

* * * * *